(12) United States Patent
Ikehashi

(10) Patent No.: US 7,795,778 B2
(45) Date of Patent: Sep. 14, 2010

(54) ELECTROSTATIC ACTUATOR DRIVING SYSTEM HAVING PLURAL ACTUATORS AND A TEMPERATURE DETECTOR

(75) Inventor: Tamio Ikehashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 11/851,784

(22) Filed: Sep. 7, 2007

(65) Prior Publication Data

US 2009/0001845 A1    Jan. 1, 2009

(30) Foreign Application Priority Data

Sep. 8, 2006 (JP) .............................. 2006-244425

(51) Int. Cl.
*H02N 1/00* (2006.01)
*H01G 9/00* (2006.01)
(52) U.S. Cl. .................... 310/309; 200/181; 361/277
(58) Field of Classification Search .............. 310/309; 200/181; 361/277, 282
See application file for complete search history.

(56) References Cited

U.S. PATENT DOCUMENTS

| | | | |
|---|---|---|---|
| 6,307,452 B1 * | 10/2001 | Sun | 333/262 |
| 6,483,395 B2 | 11/2002 | Kasai et al. | |
| 6,646,215 B1 * | 11/2003 | Nelson | 200/181 |
| 6,657,359 B1 | 12/2003 | Hoen et al. | |
| 2003/0168928 A1 * | 9/2003 | Clark et al. | 310/309 |
| 2006/0108893 A1 | 5/2006 | Furusho | |
| 2007/0007849 A1 | 1/2007 | Ogikubo et al. | |
| 2009/0001845 A1 * | 1/2009 | Ikehashi | 310/300 |

FOREIGN PATENT DOCUMENTS

JP        2005072757      * 3/2005

* cited by examiner

*Primary Examiner*—Karl I Tamai
(74) *Attorney, Agent, or Firm*—Oblon, Spivak, McClelland, Maier & Neustadt, L.L.P.

(57) ABSTRACT

An actuator of the present invention includes a moving part, and a driving electrode which is comprised of electrode parts electrically isolated from each other and drives the moving part. A drive voltage is applied selectively to some of the electrode parts to control an electrostatic force which acts on the moving part.

9 Claims, 24 Drawing Sheets

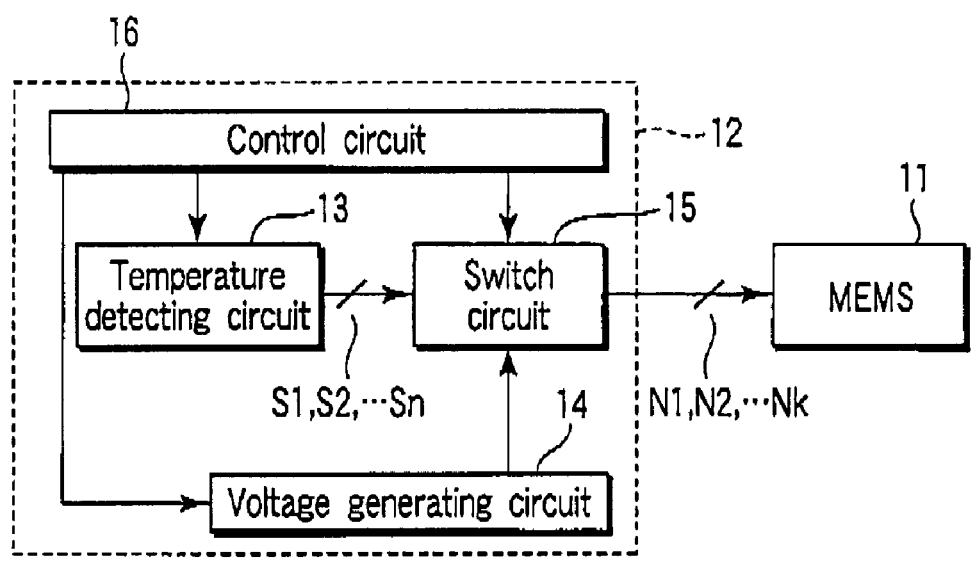
F I G. 7

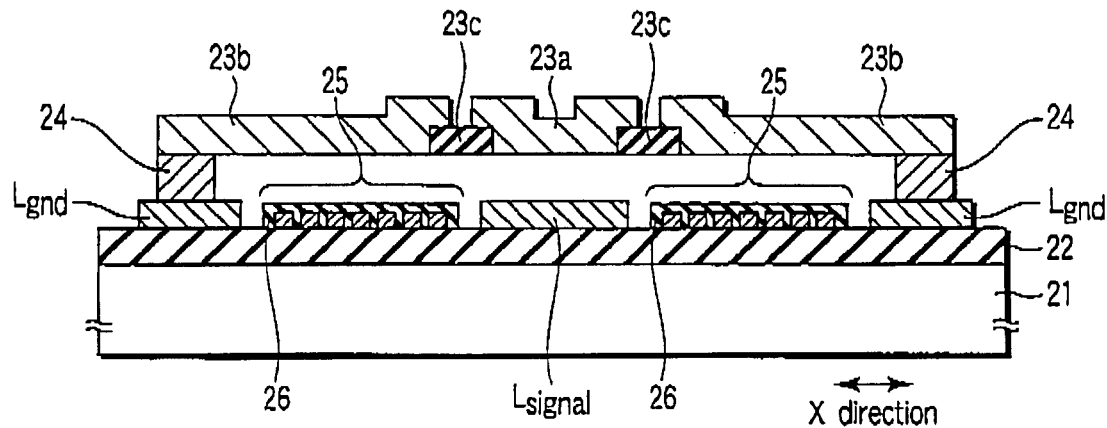
F I G. 18
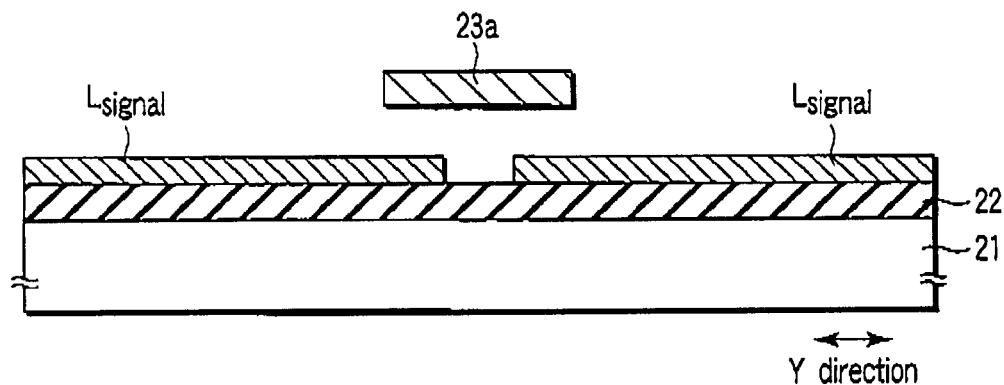
F I G. 19
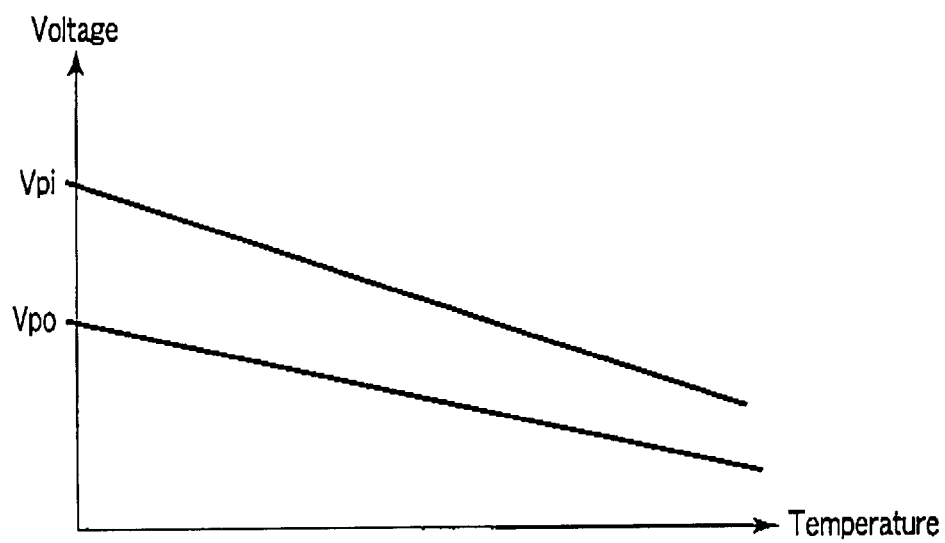
F I G. 20

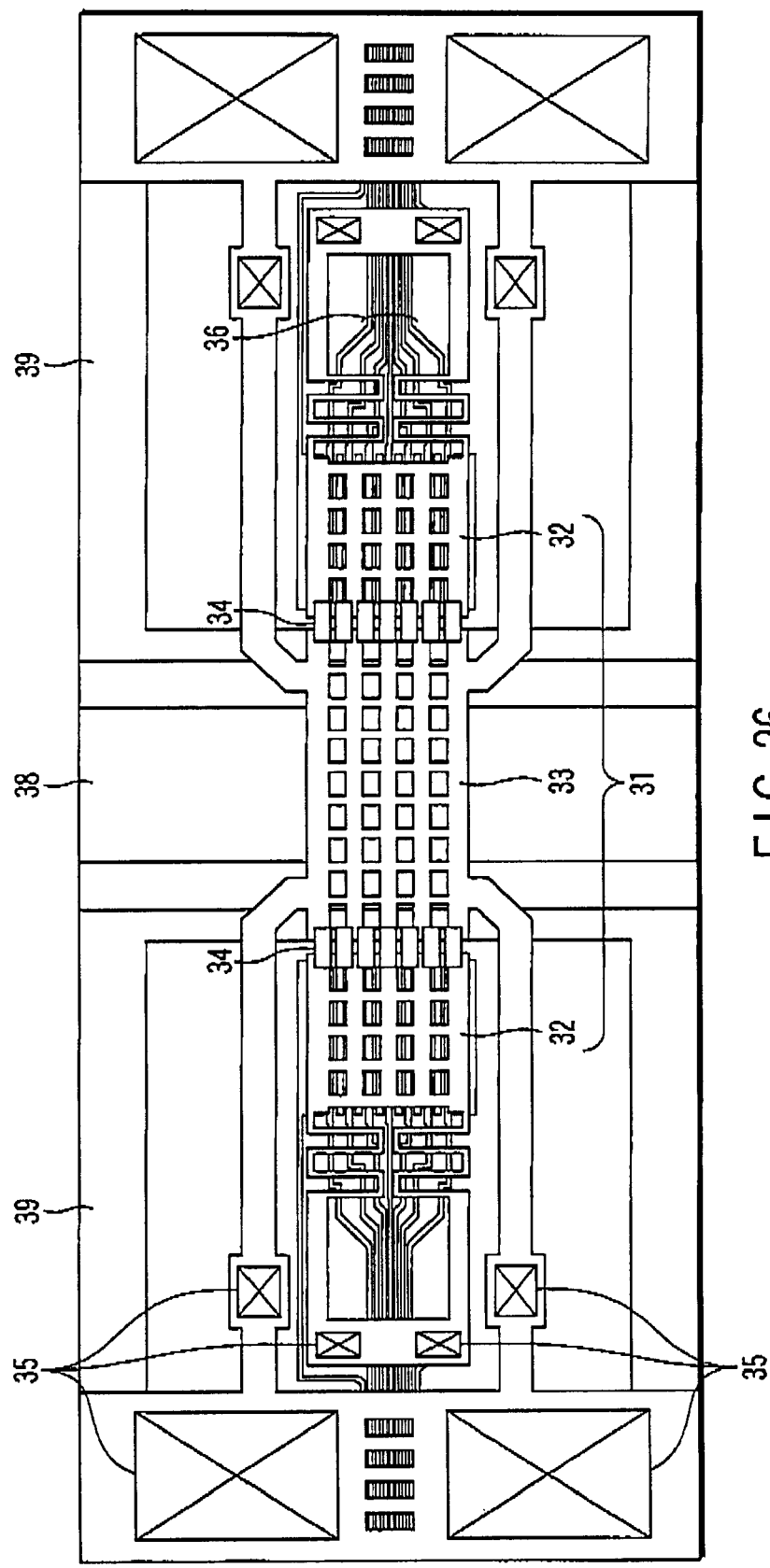
F I G. 26

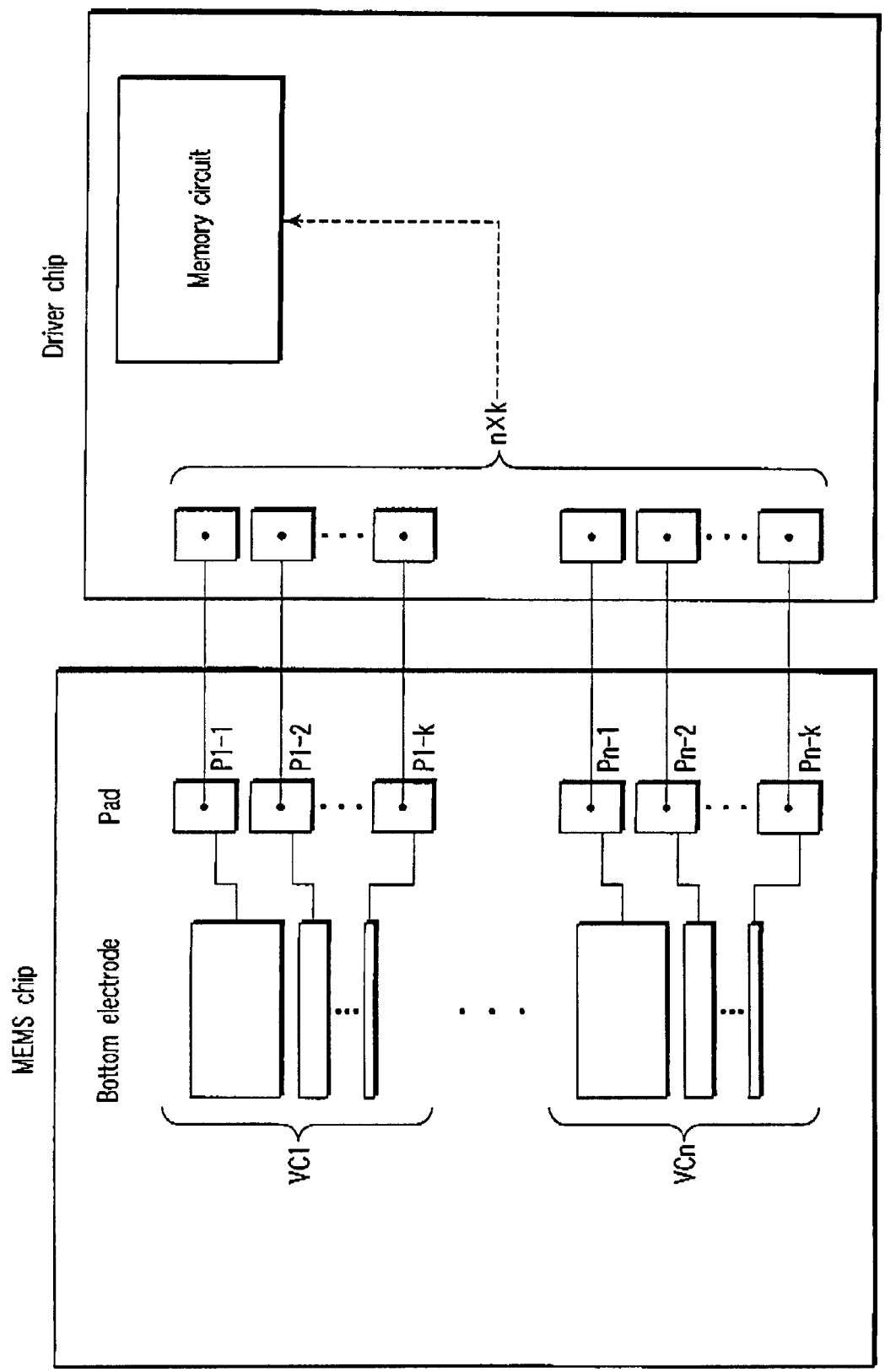
F I G. 30

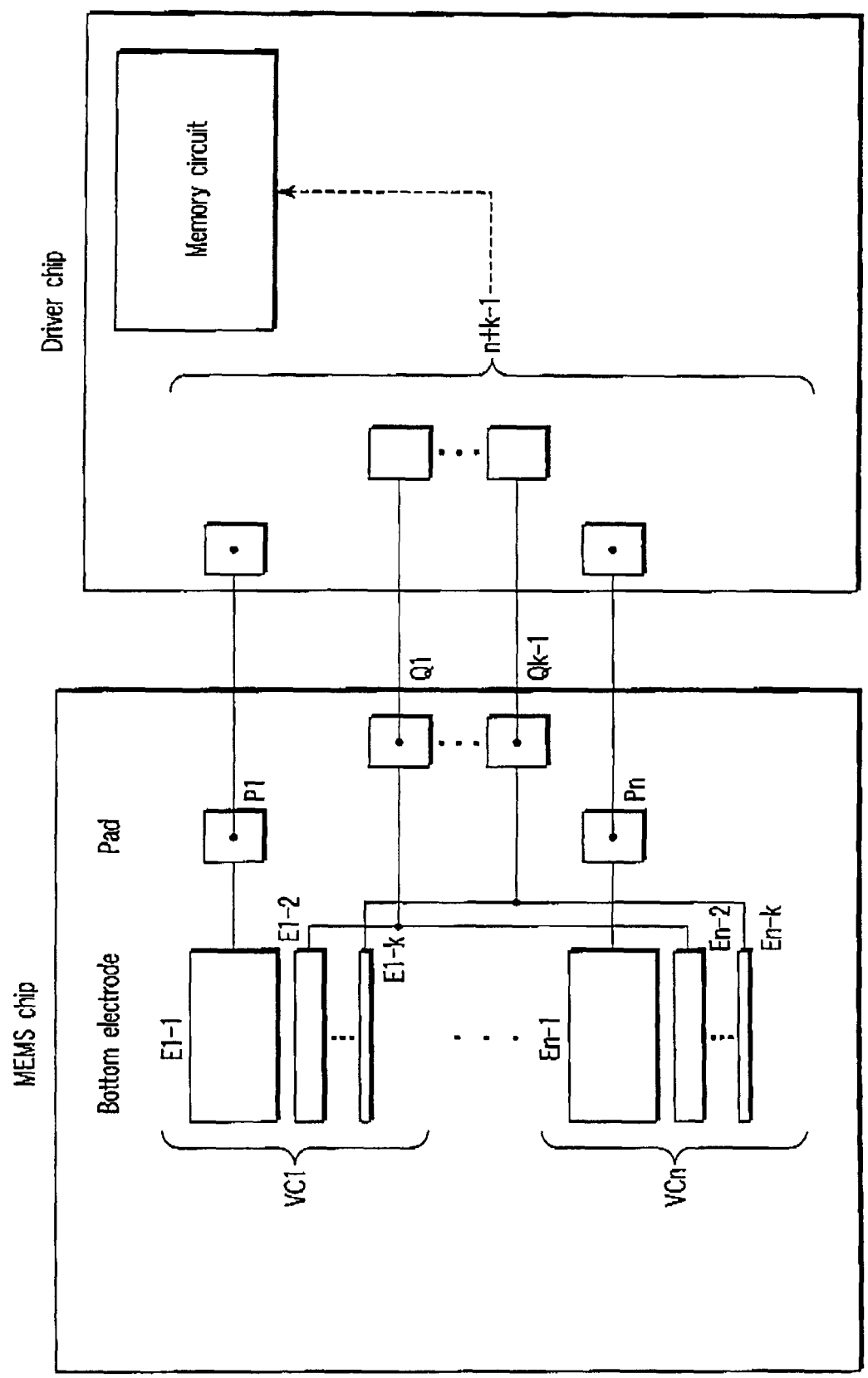
F I G. 31

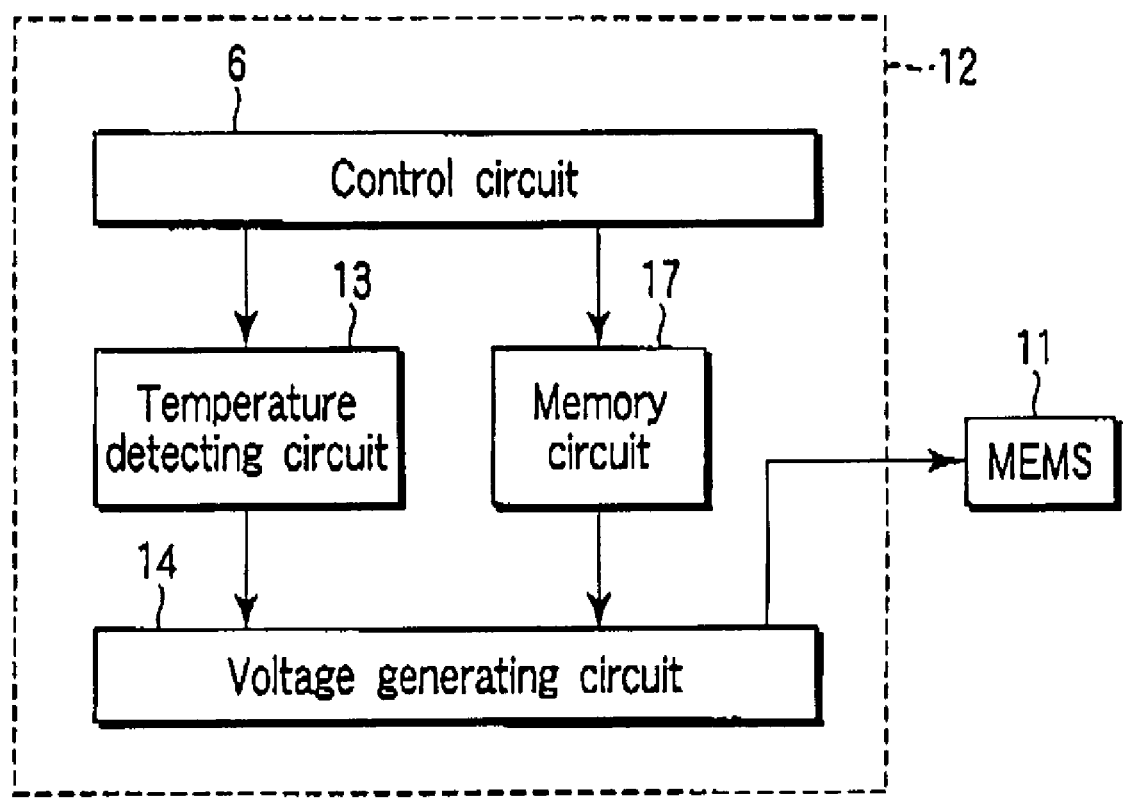
F I G. 36

ELECTROSTATIC ACTUATOR DRIVING SYSTEM HAVING PLURAL ACTUATORS AND A TEMPERATURE DETECTOR

CROSS-REFERENCE TO RELATED APPLICATIONS

This application is based upon and claims the benefit of priority from prior Japanese Patent Application No. 2006-244425, filed Sep. 8, 2006, the entire contents of which are incorporated herein by reference.

BACKGROUND OF THE INVENTION

1. Field of the Invention

The present invention relates to an actuator which composes a micro-machine or MEMS (Micro-Electro-Mechanical Systems), which is used as elements having a moving part, such as a switch and a variable capacitor.

2. Description of the Related Art

Actuators compose main sections of elements having moving parts such as switches and variable capacities (for example, see U.S. Pat. No. 6,483,395).

Actuators include electrostatic actuators. Electrostatic actuators adopt a bridge structure (both ends of a moving part are supported), and a cantilever structure (only one end of a moving part is supported).

The bridge structure has an advantage in that warpage of the moving part due to a residual stress is reduced, but at the same time, this structure has a disadvantage in that temperature dependence of a pull-in voltage and a pull-out voltage becomes great.

This temperature dependence is caused because thermal expansion coefficients of a substrate and a moving part (bridge part) are different and a spring constant K of the moving part has temperature dependence. However, it is difficult to eliminate this.

When the problem of this state is left unsolved, however, a reduction in a pull-out voltage due to the temperature dependence produces a phenomenon in which the moving part cannot be separated from an electrode (stiction).

The pull-in voltage and the pull-out voltage are fluctuated between electrostatic actuators in one chip or different chips by so-called process tolerance.

It is, therefore, desired to develop a technique which prevents deterioration in reliability of an electrostatic actuator due to the fluctuation in the pull-in voltage and the pull-out voltage.

BRIEF SUMMARY OF THE INVENTION

An actuator of an aspect of the present invention includes a moving part, and a driving electrode which is comprised of electrode parts electrically isolated from each other and drives the moving part. A drive voltage is applied selectively to some of the electrode parts to control an electrostatic force which acts on the moving part.

BRIEF DESCRIPTION OF THE SEVERAL VIEWS OF THE DRAWING

FIG. 7 is a diagram illustrating an MEMS system according to a first example;

FIG. 18 is a cross-section view taken along line XVIII-XVIII of FIG. 17;

FIG. 19 is a cross-section view taken along line XIX-XIX of FIG. 17;

FIG. 20 is a diagram illustrating temperature characteristic according to a seventh example;

FIG. 26 is a diagram illustrating a variable capacitor according to a tenth example;

FIG. 30 is a diagram illustrating a system according to an eleventh example;

FIG. 31 is a diagram illustrating a system according to a twelfth example;

FIG. 36 is a diagram illustrating a system according to a fourteenth example.

DETAILED DESCRIPTION OF THE INVENTION

An actuator of an aspect of the present invention will be described below in detail with reference to the accompanying drawings.

1. Outline

In an example of the present invention, a driving electrode which drives a moving part is comprised of a plurality of electrode parts which are electrically isolated from each other. A drive voltage is selectively applied to some of the electrode parts, so that a fluctuation of a pull-in voltage and a pull-out voltage, based on a temperature variation or a process variation, is avoided.

Figure 1:
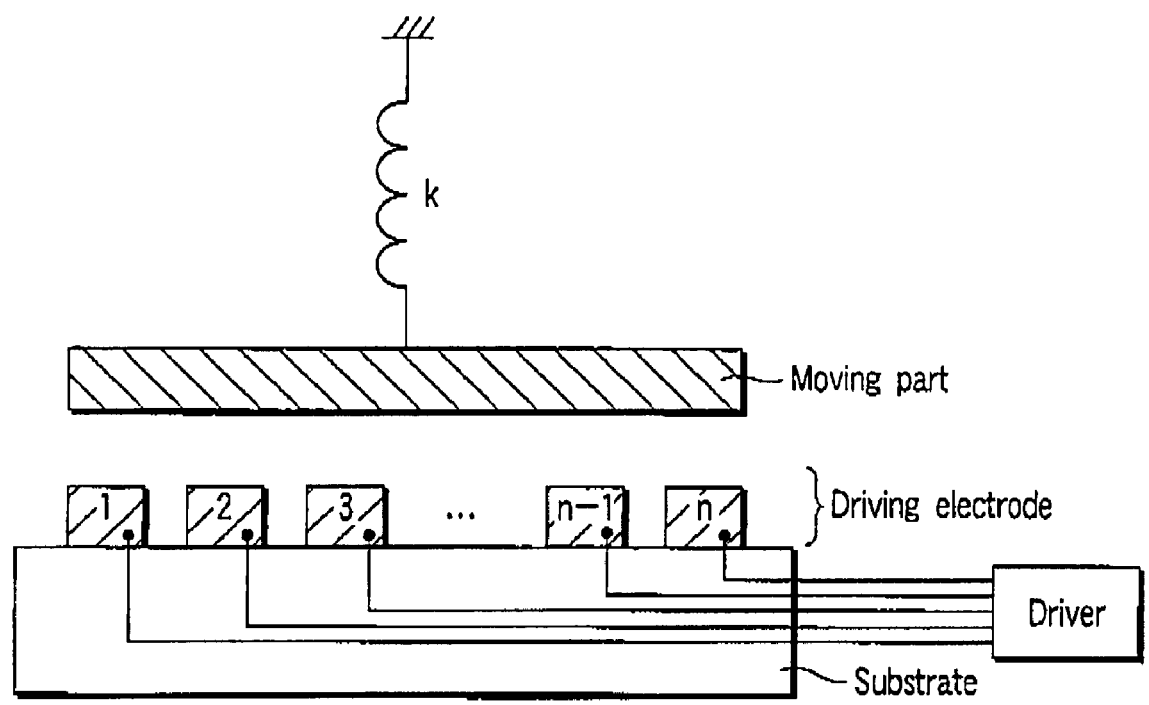
FIG. 1 is a diagram illustrating a summary of an actuator according to an example of the present invention.

In an actuator according to the example of the present invention, as shown in FIG. 1, a driving electrode is comprised of n-numbered (n: counting number of two or more) electrode parts. The n-numbered electrode parts are connected to a driver which controls a value of the drive voltage and the number of electrode parts to which the drive voltage is applied.

In this case, an electrostatic power generated between the driving electrode and a moving part is proportional to the number of the electrode parts to which the drive voltage is applied.

That is to say, when the number of the electrode parts to which the drive voltage is applied is m and an area of a part of one electrode part opposite to the moving part is S, an effective area A of the driving electrode is m×S, and an electrostatic force Q generated between the driving electrode and the moving part is proportional to m.

The remaining (n–m)-numbered electrode parts to which the drive voltage is not applied are allowed to have the same electric potential as that of the moving part.

With such a constitution, even if a spring constant K of the moving part changes due to temperature dependence, and a pull-in voltage or a pull-out voltage changes, the change in the voltage can be small by changing the value m according to temperature, thereby preventing deterioration in reliability of the actuator.

Figure 2:
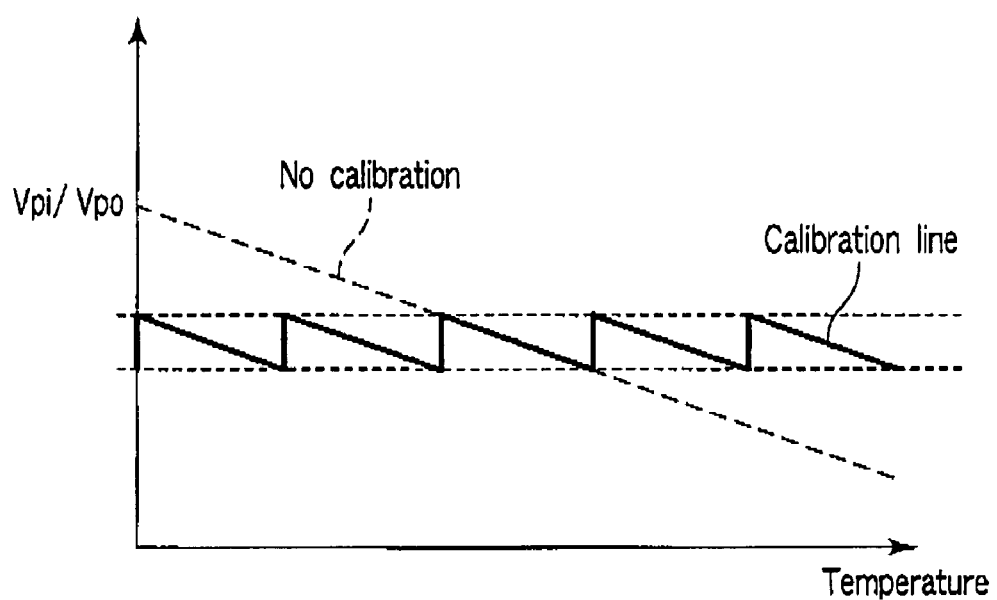
FIG. 2 is a diagram illustrating temperature dependence of a pull-in/pull-out voltage of the actuator in FIG. 1.

Concretely, since a pull-in voltage and a pull-out voltage are proportional to $\sqrt{(k/A)}$, when A is changed according to the change in k, the temperature dependency of the pull-in voltage Vpi or the pull-out voltage Vpo can be reduced as shown in FIG. 2.

k is the spring constant of the moving part.

Figure 3:
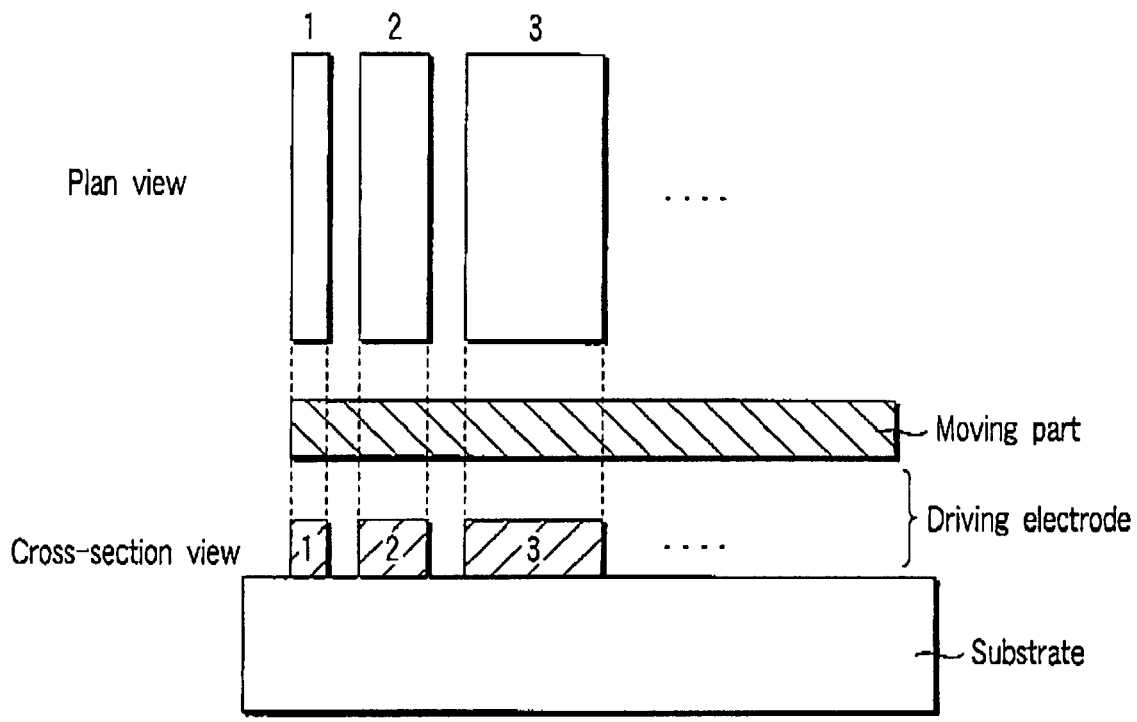
FIG. 3 is a diagram illustrating a modification of the actuator in FIG. 1.

As to the n-numbered electrode parts, as shown in FIG. 3, when the area of the portion opposite to the moving part is changed into a binary state, a driving method for the driving electrode can be simplified in comparison with the case where all the areas of the parts opposite to the moving part are uniform.

The example of the present invention is effective for compensating not only a characteristic fluctuation due to the temperature dependency but also characteristic variation among actuators on one chip and characteristic variation among actuators on different chips.

That is to say, a characteristic test is conducted on individual actuators, and the number m of the electrode parts to which a drive voltage is applied is determined according to the test result, so that the actuator characteristic can be trimmed.

2. Examples

(1) Temperature Dependence

The temperature dependence of the pull-in voltage Vpi and the pull-out voltage Vpo in the electrostatic actuator is described.

The pull-in voltage Vpi is a drive voltage necessary for attaching the moving part to a signal line side. The pull-out voltage Vpo is a drive voltage necessary for separating the moving part from the signal line side.

Figure 4:
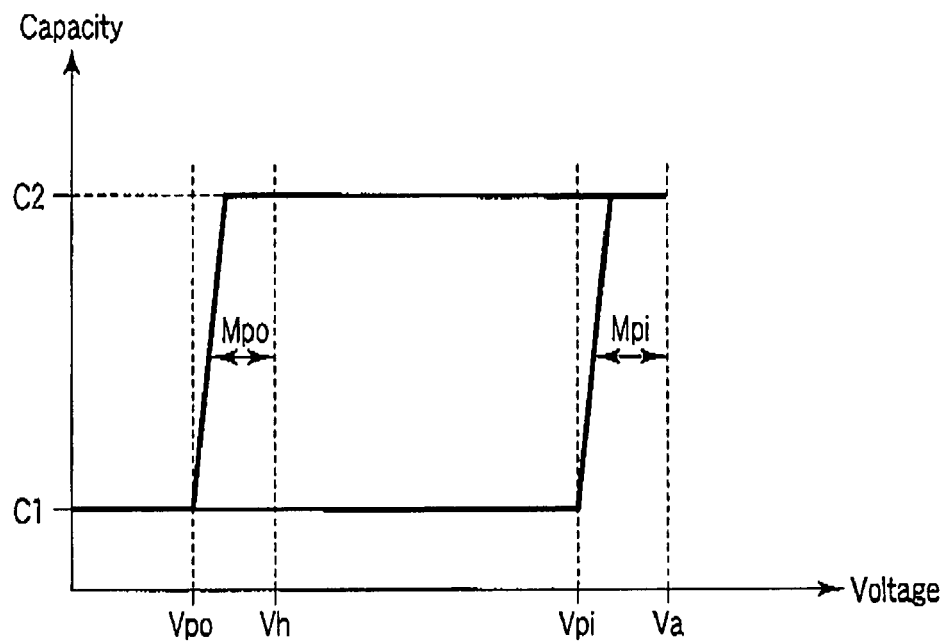
FIG. 4 is a diagram illustrating CV characteristic of an electrostatic actuator.

FIG. 4 illustrates a relationship in the drive voltage and a capacity (capacity between the moving part and the signal line).

The pull-in voltage Vpi is larger than the pull-out voltage Vpo. In order to obtain a maximum capacity C2, it is necessary to set the drive voltage to a value Va larger than the pull-in voltage Vpi. In order to obtain a minimum capacity C1, it is necessary to set the drive voltage to a value smaller than the pull-out voltage Vpo, for example, 0V.

Figure 5:
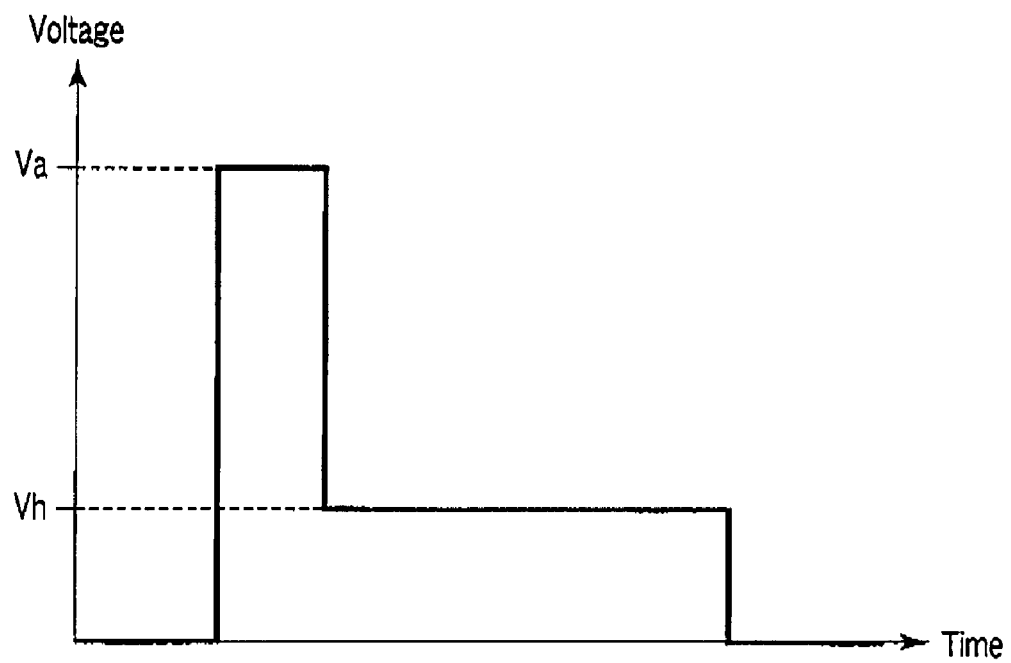
FIG. 5 is a diagram illustrating an example of a waveform of a drive voltage.

In the electrostatic actuator, a drive voltage shown in FIG. 5 is applied to the driving electrode. The voltage is lowered to Vh after pull-in in order to relax an electric field and repress charging.

Variations in the pull-in voltage Vpi and the pull-out voltage Vpo are examined. In order to stably operate the electrostatic actuator in such variations, a margin Mpi between Vpi and Va, and a margin Mpo between Vpo and Vh should have sufficient sizes.

Figure 6:
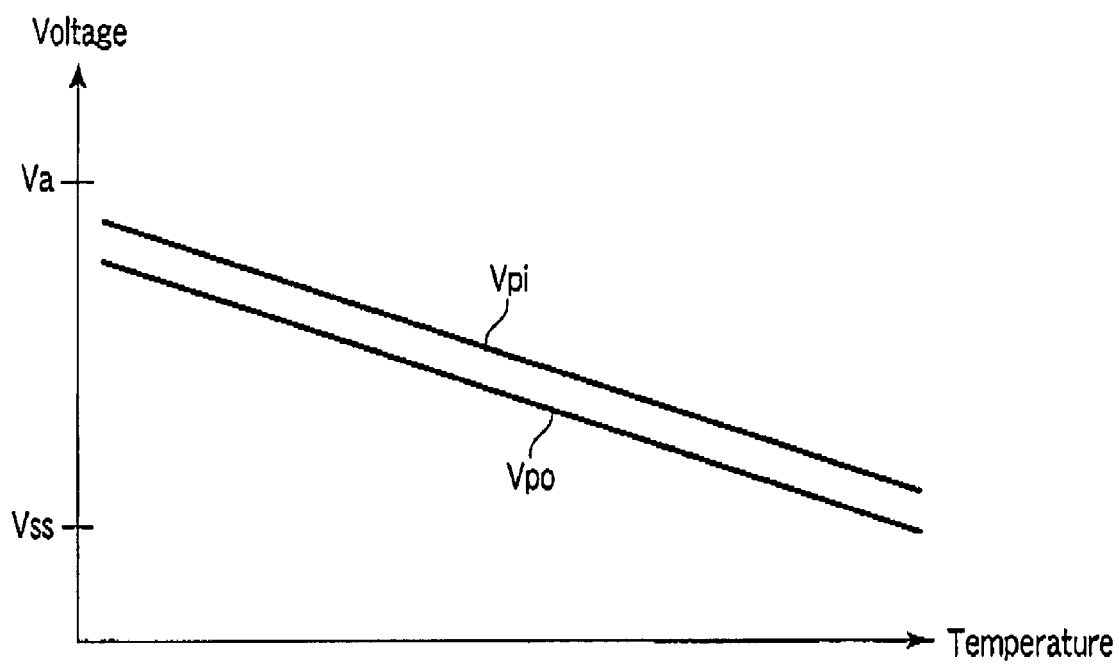
FIG. 6 is a diagram illustrating the temperature dependence of the pull-in/pull-out voltage.

When the temperature dependence causes the variations, as shown in FIG. 6, the pull-in voltage Vpi and the pull-out voltage Vpo fluctuates according to temperature. That is to say, since the spring constant k becomes small due to thermal expansion at high temperature, the pull-in voltage Vpi and the pull-out voltage Vpo are decreased according to a rise in the temperature.

For this reason, in order to attach the moving part to the signal line side (pulled in) securely independently of the temperature, it is necessary to make the drive voltage Va larger than the pull-in voltage Vpi at assumed minimum temperature.

This makes it easy to generate defective stiction in which charge trapped by an insulating layer increases, and thus even when the voltage is set to 0V, the electrode is not separated.

(2) First Example

FIG. 7 illustrates an MEMS system according to a first example.

This system is comprised of an MEMS 11 and a driver 12.

The MEMS 11 and the driver 12 may be mounted onto one chip in a mixed manner, or may be formed on different chips.

The MEMS 11 has a driving electrode comprised of a plurality of electrode parts as shown in FIG. 1 or 3.

The driver 12 has a temperature detecting circuit 13, a voltage generating circuit 14, a switch circuit 15 and a control circuit 16.

The temperature detecting circuit 13 monitors temperature of a chip on which the MEMS 11 is formed, and outputs control signals S1, S2, . . . Sn for determining the number of electrode parts to which the drive voltage is applied according to the temperature.

The voltage generating circuit 14 generates a drive voltage.

The switch circuit 15 is a circuit which transfers a drive voltage to a selected electrode part based on the control signals S1, Sn, . . . Sn.

The control circuit 16 controls operations of the temperature detecting circuit 13, the voltage generating circuit 14 and the switch circuit 15.

Figure 8:
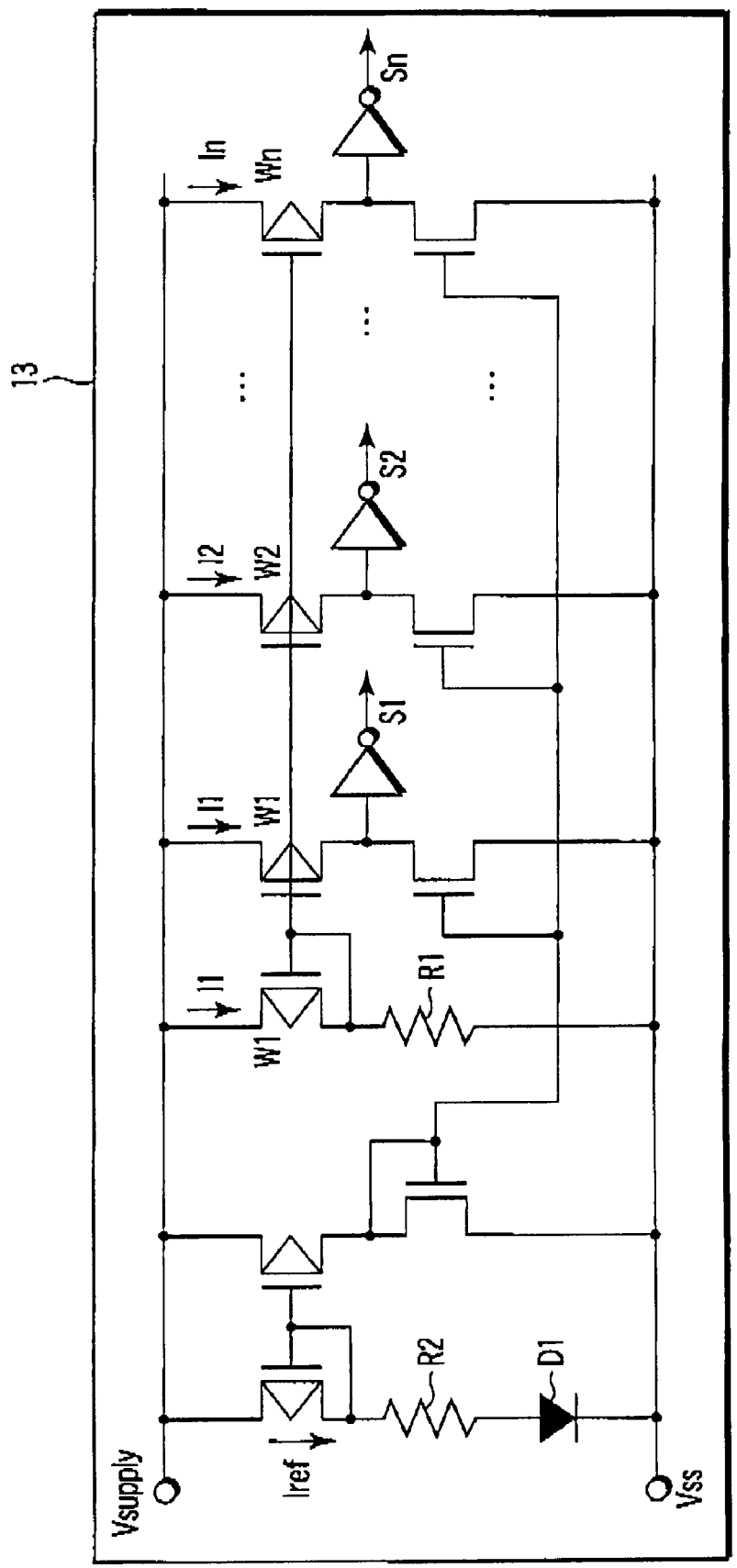
FIG. 8 is a diagram illustrating an example of a temperature detecting circuit.

The temperature detecting circuit 13 is comprised of a circuit shown in FIG. 8, for example. This circuit detects temperature using a difference in the temperature characteristics between an electric current I1, . . . determined by a resistance element R1 and an electric current Iref determined by a resistance element R2 and a diode D1.

Concretely, the temperature characteristics are different between Iref and I1, . . . by using the temperature dependence of the diode D1.

For example, the temperature dependence of I1, I2, . . . In may be eliminated. In this case, a reference voltage generated by a BGR circuit is used as Vsupply. The electric currents I1, I2, . . . In are controlled by gate widths W1, . . . Wn of a P-channel MOS transistor. I1<I2< . . . In.

Figure 9:
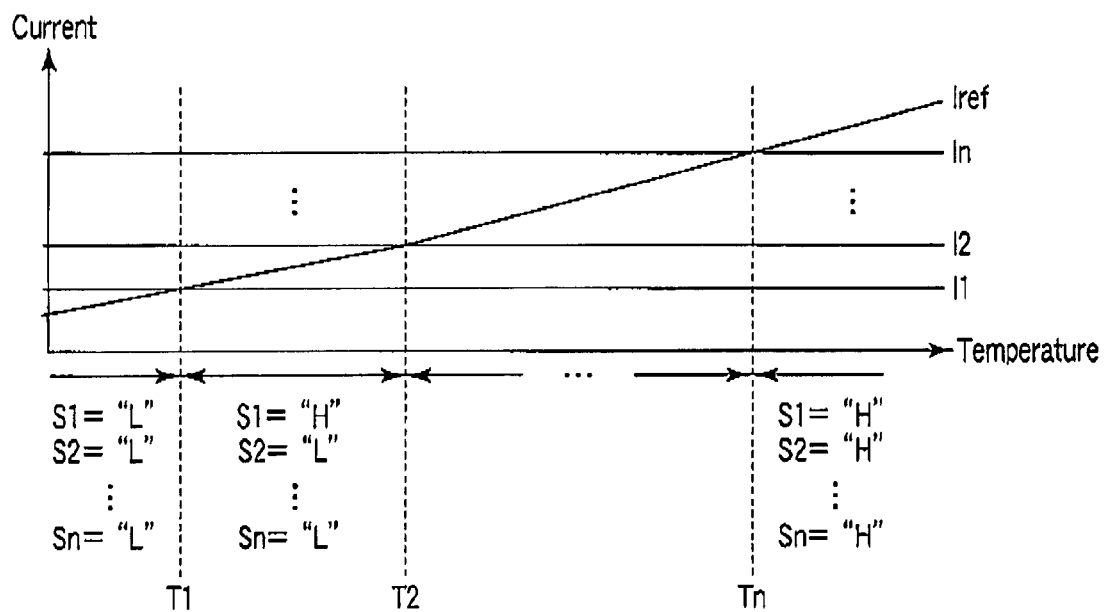
FIG. 9 is a diagram illustrating a relationship between an output signal and temperature of the temperature detecting circuit in FIG. 8.

In this case, as shown in FIG. 9, intersecting points between the temperature characteristic of Iref and the temperature characteristics of I1, I2, . . . In are defined as temperatures T1, T2, . . . Tn.

The control signals S1, S2, . . . Sn to be output from the temperature detecting circuit 13, therefore, indicate different values according to the temperatures, so that the temperature can be detected by the value of the control signals S1, S2, . . . Sn.

It is important that the temperature detecting circuit 13 generates two electric currents having different temperature characteristics. It is not necessary that any one of them is an electric current source without temperature dependence. For this reason, although the diode and the resistances are used in FIG. 8, the other elements may be used.

In FIG. 8, the diode having temperature characteristic is used for generating one of two electric currents with different temperature characteristics, but two diodes having different temperature characteristics may be used so as to generate two electric currents.

Figure 10:
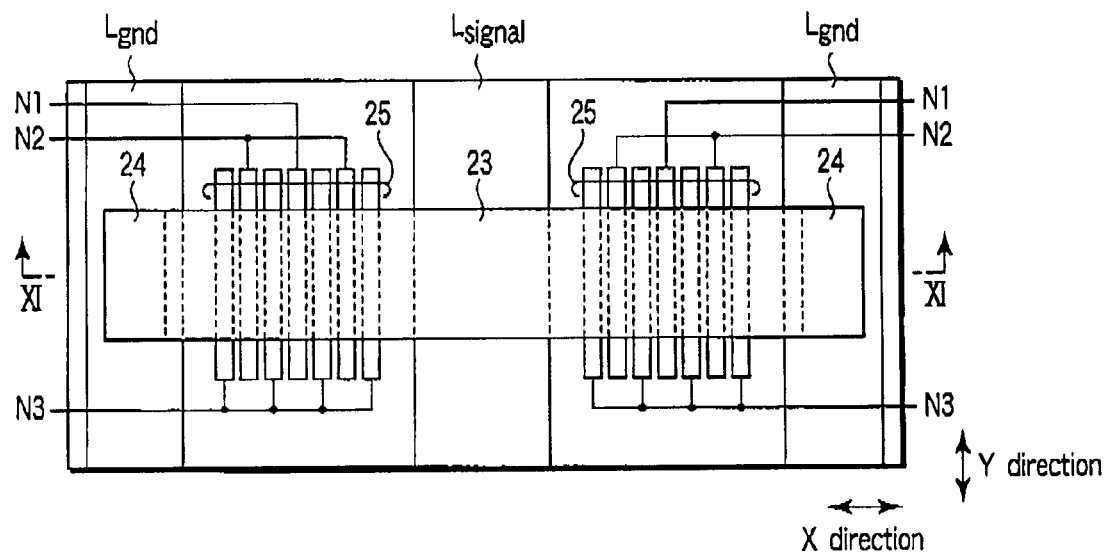
FIG. 10 is a plan view illustrating a structure of MEMS.
Figure 11:
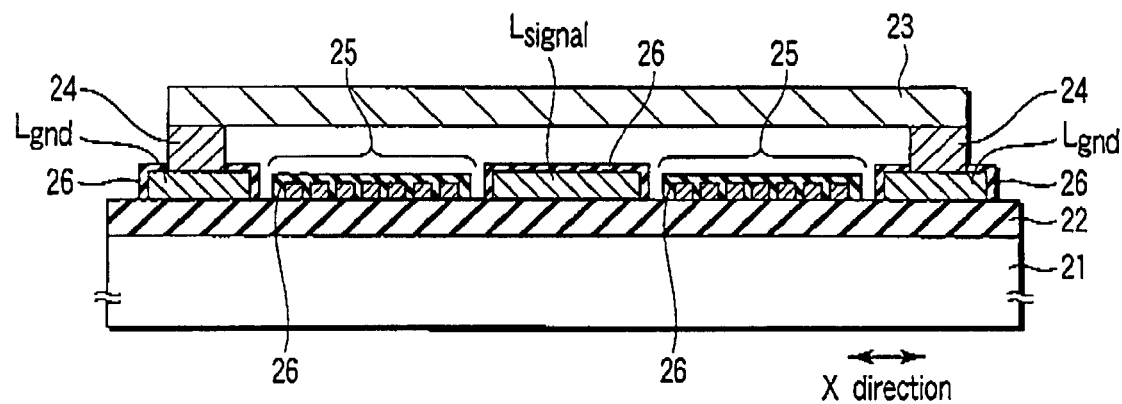
FIG. 11 is a cross-section view taken along line XI-XI of FIG. 10.

FIG. 10 illustrates a constitutional example of MEMS. FIG. 11 is a cross-section view taken along line XI-XI of FIG. 10.

This constitutional example shows a binary variable capacitor using a bridge-structured actuator. This constitutional example has a property that a capacity between a signal line Lsignal and a ground line Lgnd is controlled by the moving part.

An insulating layer 22 is formed on a semiconductor substrate 21. The signal line Lsignal and the ground line Lgnd are formed on the insulating layer 22. The signal line Lsignal and the ground line Lgnd extend to a direction Y. The signal line Lsignal is arranged between the two ground lines Lgnd.

The moving part 23 which extends to a direction X is formed above the signal line Lsignal. Both ends of the moving part 23 is supported by anchors 24. The moving part 23 and the anchors 24 are comprised of electrically conducting materials, and are electrically connected to the ground lines Lgnd.

A driving electrode 25 is formed between the signal line Lsignal and the ground line Lgnd and just below the moving part 23. The driving electrode 25 is comprised of a plurality of electrode parts electrically isolated from each other.

In this example, three signals N1, N2 and N3 are output from the switch circuit 15 in FIG. 7, and the effective area of the driving electrode 25 is allowed to be changed in 8 ways.

This is only one example, and a method for changing the effective area of the driving electrode 25 is not limited to this example.

The signal line Lsignal, the ground line Lgnd and the driving electrode 25 are covered with the insulating layers 26, respectively.

In such an MEMS system, as shown in FIG. 9, when all the control signals S1, S2, . . . Sn are "L", the temperature of the chip on which MEMS is formed is recognized as less than T1. In this case, in order to pull the moving part 23 in the signal line Lsignal, all the signals N1, N2 and N3 are set at a drive voltage.

When the chip temperature changes and, as shown in FIG. 9, S1 of the control signals S1, S2, . . . Sn is "H", and all the remaining control signals S2, . . . Sn are "L", the chip temperature is recognized as within a range of T1 or more to less than T2. In this case, in order to pull the moving part 23 in the signal line Lsignal, the signals N2 and N3 are set to a drive voltage, and the signal N1 is set to a ground potential.

Similarly as shown in Table 1, the number of the electrode parts to which the drive voltage is applied is changed according to the temperature change. As a result, even if a pull-in voltage and a pull-out voltage fluctuate due to the temperature change, the reliability of the actuator is not deteriorated.

TABLE 1

| Temperature | S1 | S2 | S3 | Pull-in | | |
|---|---|---|---|---|---|---|
| | | | | N1 | N2 | N3 |
| T < T1 | "L" | "L" | "L" | Va | Va | Va |
| T1 ≦ T < T2 | "H" | "L" | "L" | Vss | Va | Va |
| T2 ≦ T < T3 | "L" | "H" | "L" | Va | Vss | Va |
| T3 ≦ T < T4 | "H" | "H" | "L" | Vss | Vss | Va |
| T4 ≦ T < T5 | "L" | "L" | "H" | Va | Va | Vss |
| T5 ≦ T < T6 | "H" | "L" | "H" | Vss | Va | Vss |
| T6 ≦ T < T7 | "L" | "H" | "H" | Va | Vss | Vss |

Va: Drive voltage
Vss: Ground voltage

Figure 12:
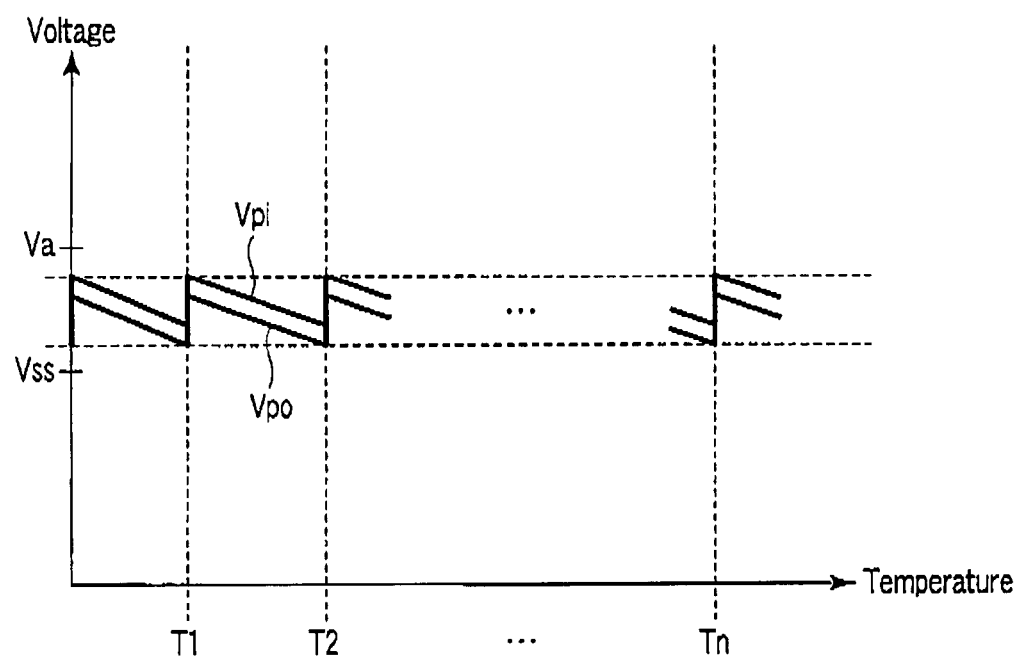
FIG. 12 is a diagram illustrating the temperature dependence of the pull-in/pull-out voltage.

That is to say, as shown in FIG. 12, when the temperature rises and the spring constant k becomes small so that the pull-in voltage Vpi and the pull-out voltage Vpo are reduced, the effective area of the driving electrode is gradually reduced accordingly, thereby keeping a fluctuation amount of the pull-in voltage Vpi and the pull-out voltage Vpo small.

It can be, therefore, considered that the temperature dependence of the pull-in voltage Vpi and the pull-out voltage Vpo is substantially eliminated, and thus a difference between the drive voltages Va and Vss can be small.

Various relations between the temperature and the control signals other than those in Table 1 can be considered. For example, when T<T1, N1=Vss, N2=Va and N3=Va.

(3) Second Example

Figure 13:
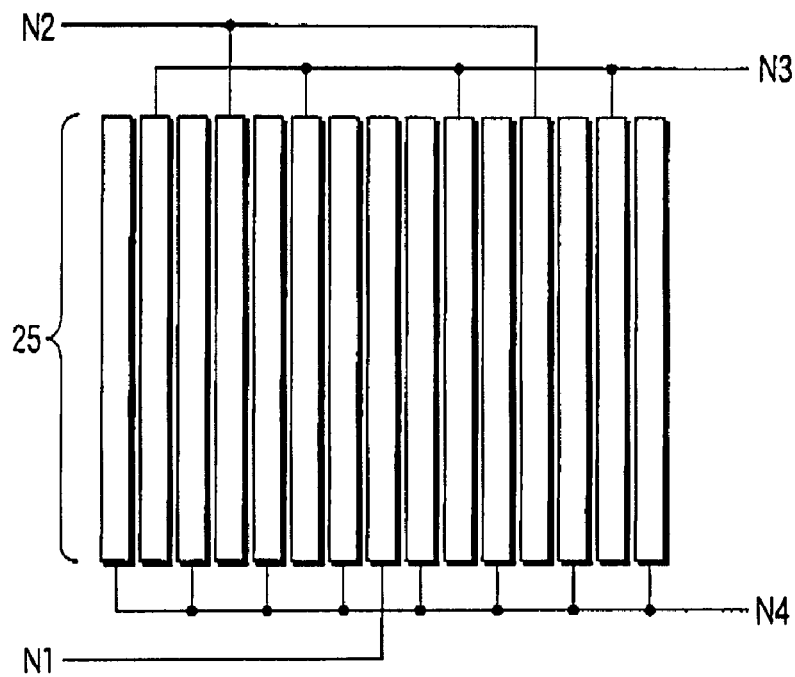
FIG. 13 is a diagram illustrating a driving electrode of MEMS according to a second example.

FIG. 13 illustrates the driving electrode of MEMS according to a second example.

Since the MEMS system is the same as that in the first example, the description thereof is omitted.

The characteristic of the second example resides in the number of the electrode parts composing the driving electrode 25 of MEMS. That is to say, four signals N1, N2, N3 and N4 are output from the switch circuit 15 in FIG. 7, and the effective area of the driving electrode 25 can be changed in 16 ways.

The driving electrode 25 in FIG. 13 is arranged on two spaces between the signal line Lsignal and the ground line Lgnd of MEMS in FIGS. 10 and 11.

(4) Third Example

Figures 14, 15:
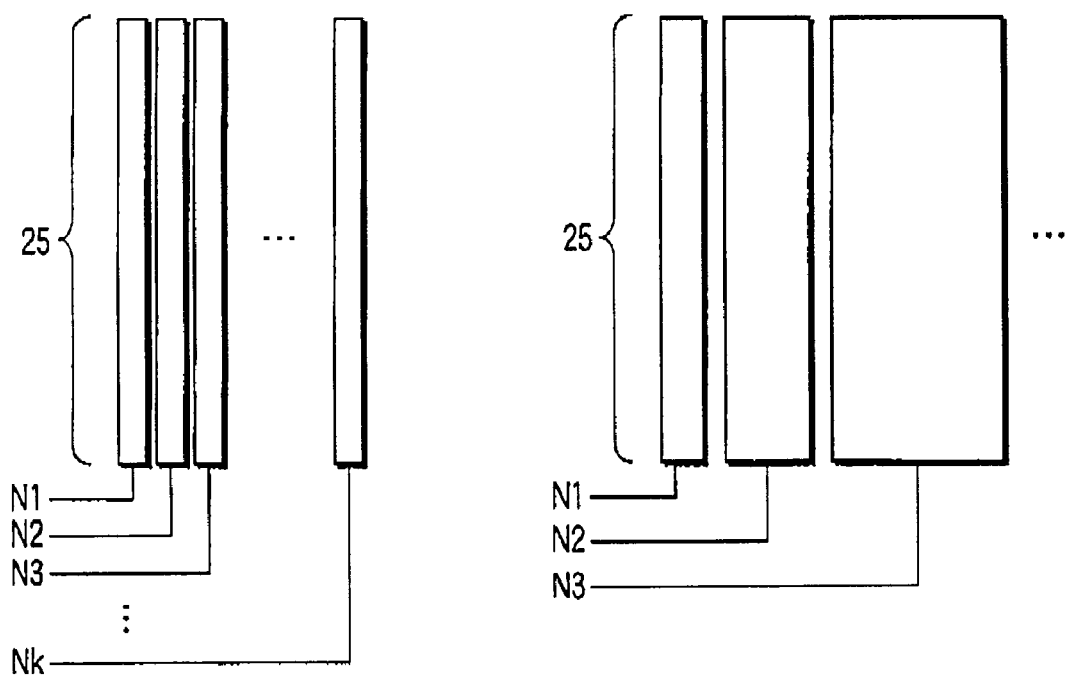
FIG. 14 is a diagram illustrating the driving electrode of MEMS according to a third example.
FIG. 15 is a diagram illustrating the driving electrode of MEMS according to a fourth example.

FIG. 14 illustrates the driving electrode of MEMS according to a third example.

The MEMS system is the same as that in the first example.

A difference of the third example from the first example is that a drive voltage can be applied independently to each of the plurality of electrode parts composing the driving electrode 25.

In this case, the number of the signals N1, N2, N3, . . . Nk to be output from the switch circuit 15 in FIG. 7 increases in proportion to the number of the electrode parts of the driving electrode 25.

The driving electrode 25 in FIG. 14 is arranged on two spaces between the signal line Lsig and the ground line Lgnd of MEMS in FIGS. 10 and 11.

(5) Fourth Example

FIG. 15 illustrates the driving electrode of MEMS according to a fourth example.

The MEMS system is the same as that in the first example.

The characteristic of the fourth example resides in the size of the electrode parts composing the driving electrode 25 of MEMS. That is to say, the area of the electrode parts increases binary. This size is equivalent to a size when the electrode parts to which the same signal is applied are combined into one in FIGS. 10 and 11.

In this case, the MEMS system can be operated by the temperature control similar to that in the first example.

The driving electrode 25 in FIG. 15 is arranged on two space between the signal line Lsignal and the ground line Lgnd of MEMS in FIGS. 10 and 11.

(6) Fifth Example

Figure 16:
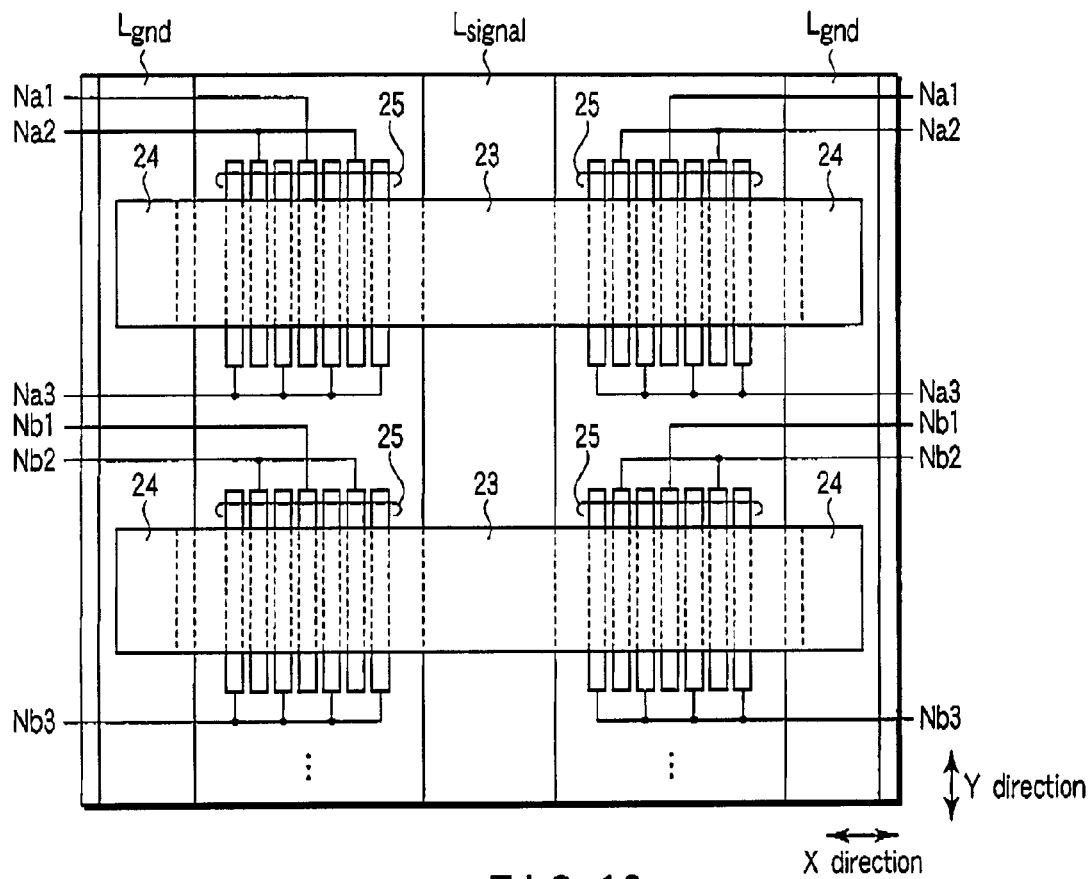
FIG. 16 is a plan view illustrating the structure of MEMS according to a fifth example.

FIG. 16 illustrates a constitution of MEMS according to a fifth example.

The MEMS system is the same as that in the first example.

A difference of the fifth example from the first example is that a plurality of electrostatic actuators is arranged on the signal line Lsignal.

The plurality of electrostatic actuators has the uniform constitution, for example, the constitution shown in FIGS. 10 and 11, and operates independently from each other. That is to say, a signal to be applied to the driving electrode 25 varies in respective actuators.

When an overlap area between the upper electrode and the signal line is changed binary, a $2^n$-value can be realized as the value of the variable capacities in n-numbered actuators. In the respective actuators, binary is realized as the value of the variable capacitor.

(7) Sixth Example

In the first to fifth examples, the electrostatic actuator composes the variable capacitor, but the electrostatic actuator can be replaced with a switch.

The case where a switch is used as the variable capacitor of the first example is described.

Figure 17:
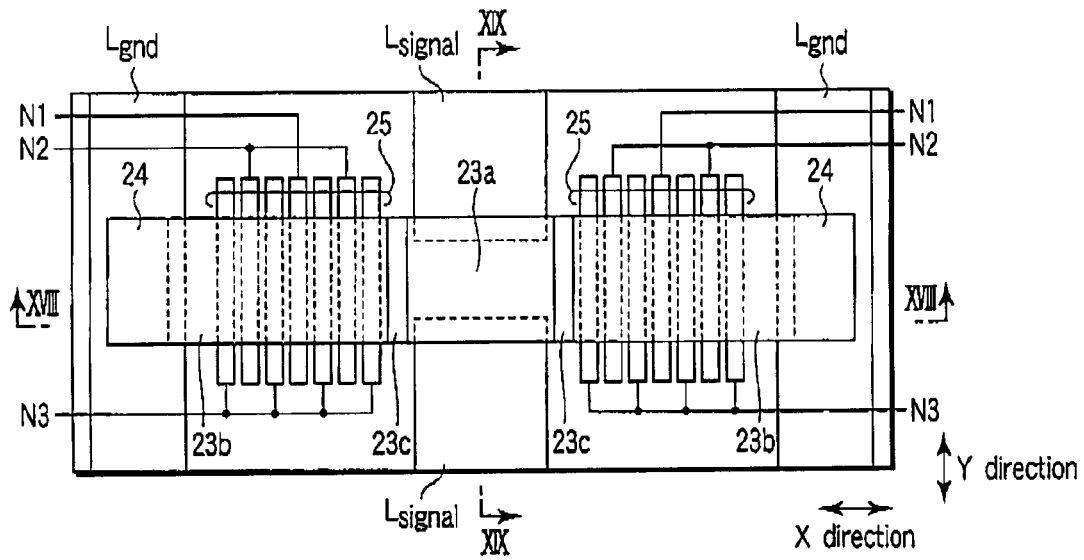
FIG. 17 is a plan view illustrating the structure of MEMS according to a sixth example.

FIG. 17 illustrates a constitution of MEMS according to the sixth example. FIG. 18 is a cross-section view taken along line XVIII-XVIII of FIG. 17, and FIG. 19 is a cross-section view taken along line XIX-XIX of FIG. 17.

The MEMS system is the same as that in the first example.

Differences of the sixth example from the first example are that the signal line Lsignal is cut just below the moving part 23a, the signal line Lsignal is not covered with the insulating layer 26, and the moving part is comprised of a plurality of elements 23a, 23b and 23c.

The moving part 23c is comprised of an insulator and electrically isolates the moving parts 23a and 23b from each other. The moving part 23a electrically connects the cut signal line Lsignal. The moving part 23b is connected to the ground lines Lgnd, and generates an electrostatic force between the moving part 23b and the driving electrodes 25.

The example of the present invention can be applied also to the switch.

(8) Seventh Example

The seventh example relates to a driving system of the moving part in the electrostatic actuator.

FIG. 20 illustrates an example of the temperature dependence of the pull-in voltage Vpi and the pull-out voltage Vpo.

The temperature characteristic of the pull-in voltage Vpi is occasionally different from the temperature characteristic of the pull-out voltage Vpo. This is because the pull-out voltage Vpo depends on also a power other than the electrostatic force generated between the moving part and the driving electrode, concretely, a van der Waals power.

Regarding the temperature dependence on the van der Waals power, it is effective to change the number of electrode parts to which the drive voltage is applied before and after pull-in.

For example, the number of the electrode parts are reduced to (m−j) after pull-in, when the number of the electrode parts to which the drive voltage is applied before pull-in is m.

The (m−j)-numbered electrode parts to which the drive voltage is applied after pull-in are some of the r-numbered electrode parts to which the drive voltage is applied before pull-in. This is for preventing the drive voltage from temporarily falling below the pull-out voltage Vpo when the number of the electrode parts to which the drive voltage is applied is switched.

(9) Eighth Example

An eighth example relates to a drive voltage control system.

In order to prevent the deterioration in the reliability of the electrostatic actuator due to the fluctuations in the pull-in voltage Vpi and the pull-out voltage Vpo, like the above examples, the effective area of the driving electrode is changed according to the temperature, and a fluctuation margin between the pull-in voltage Vpi and the pull-out voltage Vpo is reduced. This approach is very effective.

Besides this approach, the value of the drive voltage is fluctuated according to the fluctuation in the pull-in voltage Vpi and the pull-out voltage Vpo, and the margin Mpi between the pull-in voltage Vpi and the drive voltage Va, and the margin Mpo between the pull-out voltage Vpo and the drive voltage Vh are made to be approximately constant. As a result, the deterioration in the reliability of the electrostatic actuator is prevented.

This approach is effective particularly for the case where an increase in a charge dose at high temperature is more noticeable than a reduction in a peeling power (pull-out voltage Vpo) at high temperature.

Figure 21:
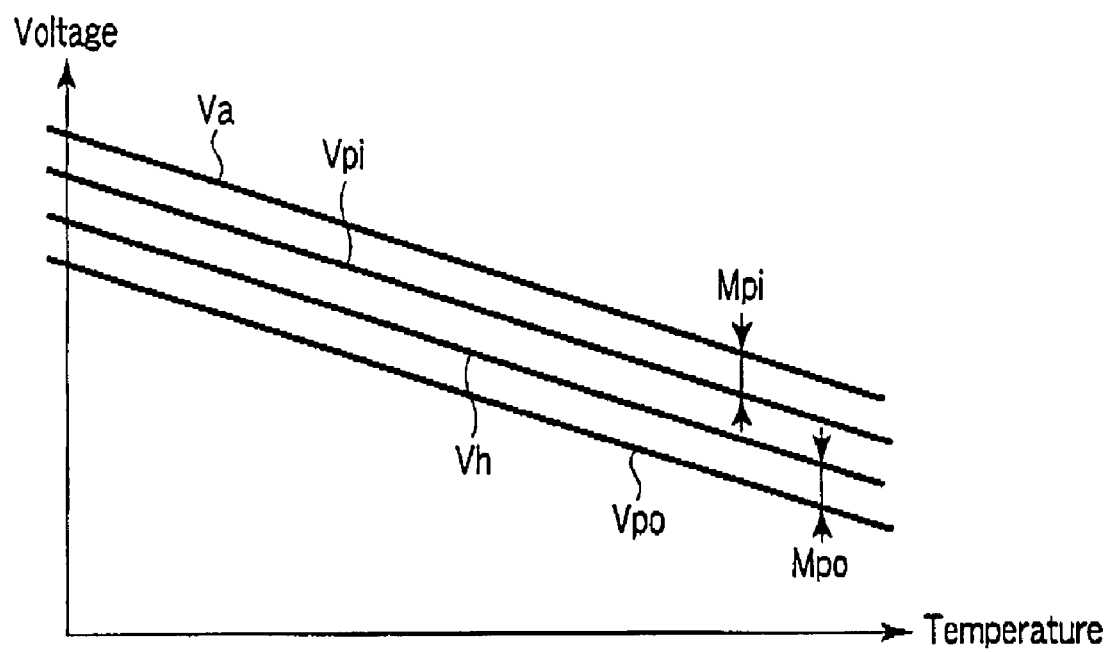
FIG. 21 is a diagram illustrating temperature characteristic according to an eighth example.

FIG. 21 illustrates an example of the temperature dependence of the drive voltages Va and Vh.

The pull-in voltage Vpi and the pull-out voltage Vpo are lowered due to the temperature dependence according to a rise in the temperature. Therefore, the drive voltage Va for pull-in and the drive voltage Vh for holding are also lowered according to the rise in the temperature.

As a result, the margin Mpi between the pull-in voltage Vpi and the drive voltage Va, and the margin Mpo between the pull-out voltage Vpo and the drive voltage Vh can be always made to be approximately constant independently of the temperature. For this reason, an electric field which is applied to the insulating layer between the driving electrode and the moving part, and the insulating layer between the signal line and the moving part does not become too large, thereby contributing to an improvement in the reliability of the electrostatic actuator.

Figure 22:
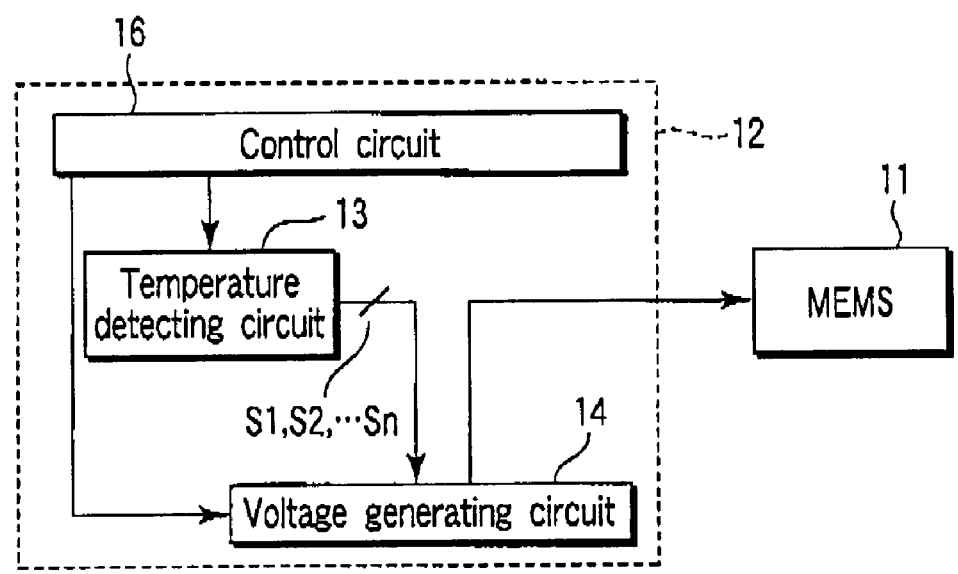
FIG. 22 is a diagram illustrating the MEMS system for realizing the characteristic of FIG. 21.

FIG. 22 illustrates an example of the MEMS system for realizing the characteristic of FIG. 21.

This system is comprised of the MEMS 11 and the driver 12.

The MEMS 11 and the driver 12 may be mounted to one chip in a mixed manner, or may be formed on different chips.

The type and the constitution of the MEMS 11 are not particularly limited in the eighth example. That is to say, all type and constitutions can be applied to the actuator as long as the characteristic changes according to temperature.

For example, this system is effective for electrostatic actuators, thermal actuators, piezoelectric actuators, and electromagnetic actuators.

In the thermal actuators, the actuator function is provided by using a property that bimorph is deformed by heat due to an electric current. However, since the bimorph has a property that it is deformed by heat, taking this property into consideration, a technique to change a drive voltage of the actuator according to the temperature is thought to be effective for improving the performance of the thermal actuators.

This is true also for the piezoelectric actuators.

In the case of the electrostatic actuators, as described in the above examples, the driving electrodes of the actuator may be comprised of a plurality of electrode parts, or the effective area of the driving electrode may be constant like the conventional technique.

The driver 12 has the temperature detecting circuit 13, the voltage generating circuit 14 and the control circuit 16.

The temperature detecting circuit 13 monitors temperature of the chip on which the MEMS 11 is formed, and outputs the control signals S1, S2, . . . Sn for determining the value of the drive voltage according to the temperature. The voltage generating circuit 14 changes the value of the drive voltage according to the control signals S1, S2, . . . Sn, namely, a change in chip temperature.

The control circuit 16 controls the operations of the temperature detecting circuit 13 and the voltage generating circuit 14.

(10) Ninth Example

There are other causes of the fluctuation in the pull-in voltage and the pull-out voltage than temperature.

For example, MEMS is formed by a wafer process, but at this time, so-called process tolerance (variation of element characteristic) occurs. The process tolerance occurs between elements on one chip and between elements on different chips.

In particularly, a process variation in a thickness of a dummy layer causes a fluctuation of a pull-in voltage and a pull-out voltage.

By applying this example of the present invention, a margin in the process tolerance can be reduced. Thereby, the function in which a drive voltage is trimmed by changing the effective area of the driving electrode, can be used for reducing the margin in the process tolerance and reducing the temperature dependence.

Figure 23:
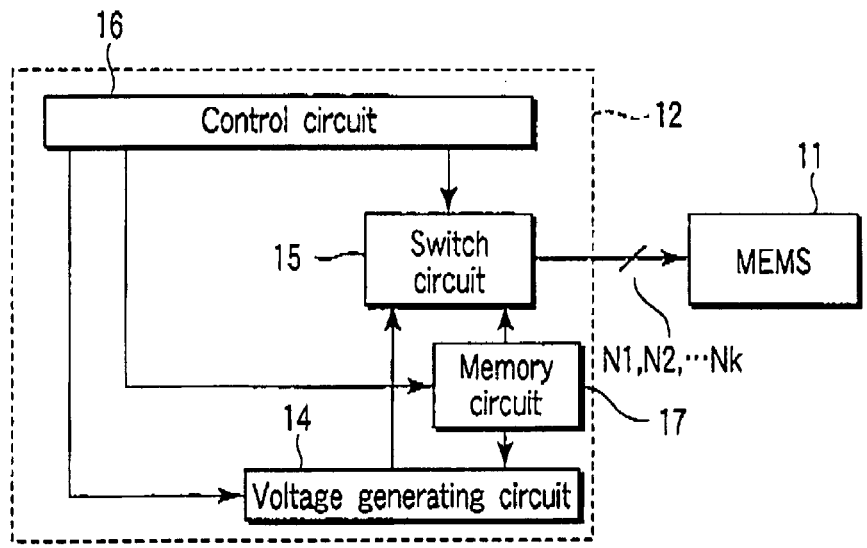
FIG. 23 is a diagram illustrating the MEMS system according to a ninth example.

FIG. 23 illustrates the MEMS system according to the ninth example.

This system is comprised of the MEMS 11 and the driver 12.

The MEMS 11 and the driver 12 may be mounted to one chip in a mixed manner, or may be formed on different chips.

The driver 12 has the voltage generating circuit 14, the switch circuit 15, the control circuit 16 and the memory circuit 17.

The voltage generating circuit 14 generates a drive voltage.

The switch circuit 15 switches the value of the drive voltage to be applied to the MEMS 11. When the MEMS 11 has the constitution shown in FIG. 1 or 3, the switching circuit 15 determines the number of electrode parts to which the drive voltage is applied.

The memory circuit 17 is comprised of a nonvolatile memory such as a flash memory or a fuse element.

The control circuit 16 controls the operations of the voltage generating circuit 14, the switch circuit 15 and the memory circuit 17.

The MEMS system tests the characteristic of the MEMS 11.

The value of the drive voltage and the number of the electrode parts to which the drive voltage is applied are determined according to the characteristic of the MEMS 11.

The data is stored as the test results in the memory circuit 17.

At the normal operation, the data stored in the memory circuit 17 is read, and the data is transmitted to the voltage generating circuit 14 and the switch circuit 15. The voltage generating circuit 14 determines the value of the drive voltage based on the data from the memory circuit 17. The switch circuit 15 determines the number of the electrode parts to which the drive voltage is applied based on the data from the memory circuit 17.

As a result, the deterioration in the reliability of the actuator due to the fluctuation in the pull-in voltage and the pull-out voltage is prevented.

Figure 24:
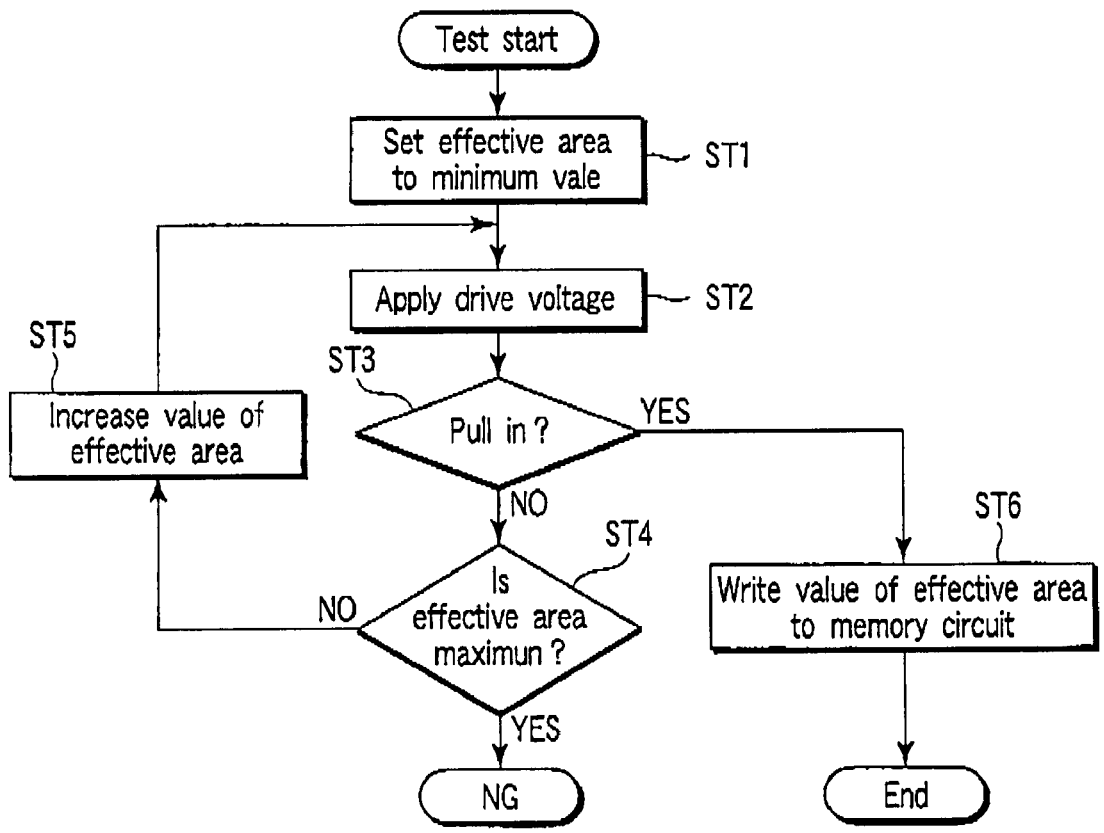
FIG. 24 is a diagram illustrating a test sequence of the MEMS system in FIG. 23.

FIG. 24 illustrates a test sequence.

The test sequence is applied to the electrostatic actuator in which the effective area of the driving electrode shown in FIG. 1 or 3 can be changed.

The effective area of the driving electrode (electrode area) is set to a minimum value (step ST1). The drive voltage is applied to the driving electrode, and the verification is conducted whether the moving part is pulled in. (steps ST2 to ST3).

When the moving part is not pulled in, the verification is conducted whether the effective area of the driving electrode has a maximum value. When the effective area does not have the maximum value, the effective area of the driving electrode is increased by one unit (steps ST4 to ST5). In the case of the electrostatic actuator of FIG. 1, since all the areas of the electrode parts are uniform, one unit is equal to the area of one electrode part (area of the portion opposite to the moving part).

The drive voltage is again applied to the driving electrode, and the verification is conducted whether the moving part is pulled in (steps ST2 to ST3).

When the moving part is not pulled in, the effective area of the driving electrode is further increased by one unit (steps ST4 to ST5) under a condition that the effective area of the driving electrode does not have the maximum value.

In the case where the moving part is not pulled in even when the effective area of the driving electrode has the maximum value, a determination is made that the electrostatic actuator is defective, and the test is ended.

When the moving part is pulled in, the data about the effective area of the driving electrode at that time is written into the memory circuit, and the test is ended.

At the time of the normal operation, the data is read from the memory circuit, and the value of the drive voltage and the number of the electrode parts to which the drive voltage is applied are determined.

The ninth example can be used by combining it with the first to eighth examples relating to the temperature dependence.

Figure 25:
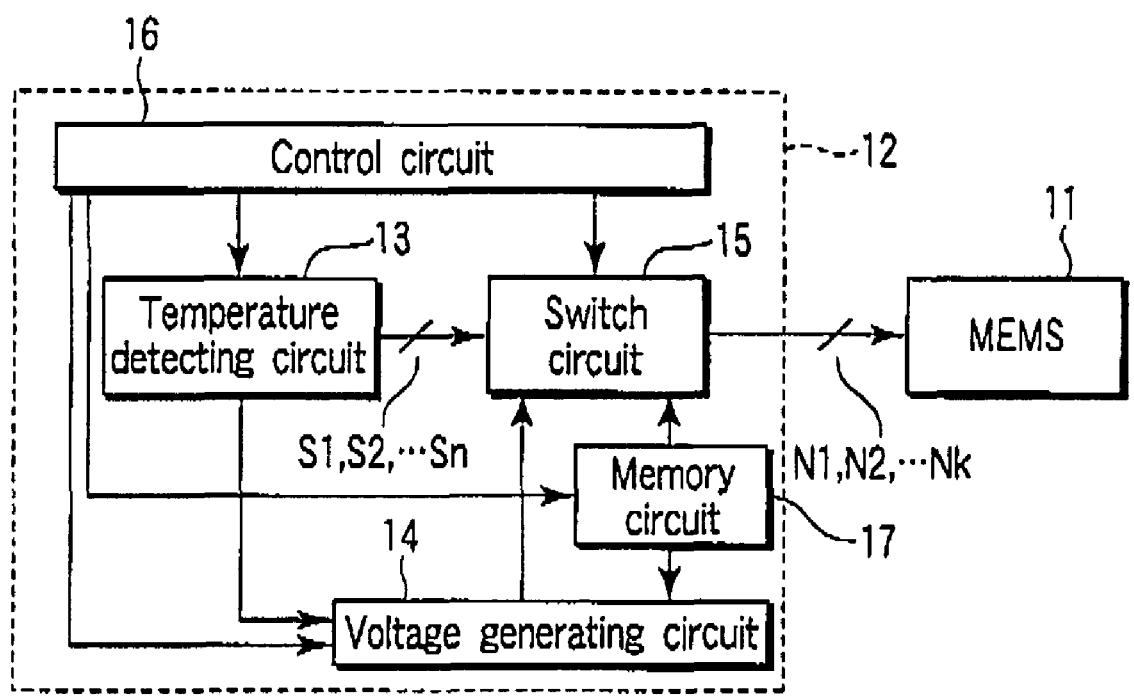
FIG. 25 is a diagram illustrating a modification of the MEMS system according to the example of the present invention.

FIG. 25 illustrates an example of the MEMS system which can simultaneously eliminate the temperature dependence and the deterioration in the characteristics due to the process tolerance.

The voltage generating circuit 14 determines the value of the drive voltage based on the data from the temperature detecting circuit 13 and the memory circuit 17. The switch circuit 15 determines the number of the electrode parts to which the drive voltage is applied based on the data from the temperature detecting circuit 13 and the memory circuit 17.

As a result, the deterioration in the reliability of the actuator due to the fluctuation in the pull-in voltage and the pull-out voltage is prevented.

(11) Tenth Example

A tenth example will describe a more concrete shape of the variable capacitor.

Figure 27:
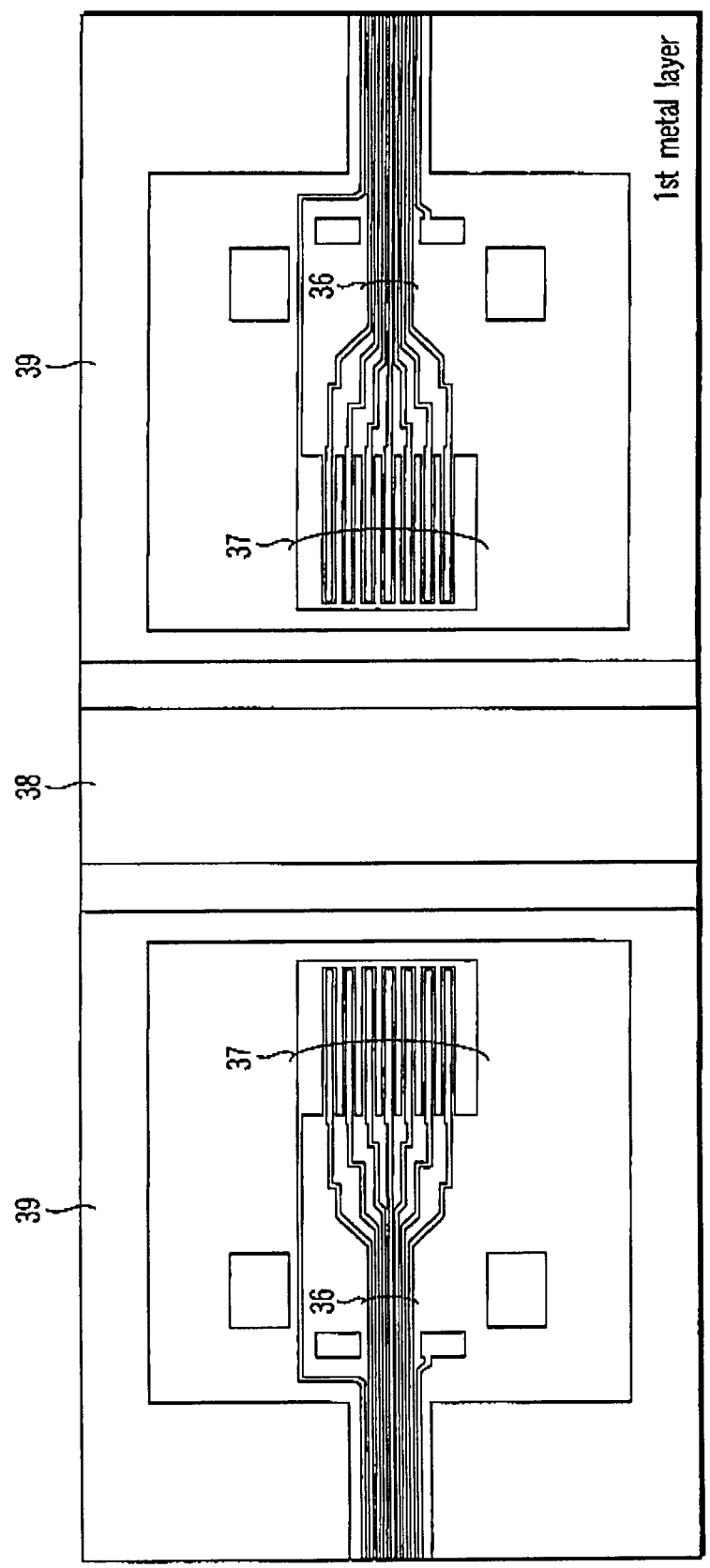
FIG. 27 is a layout of a first metal layer in FIG. 26.
Figure 28:
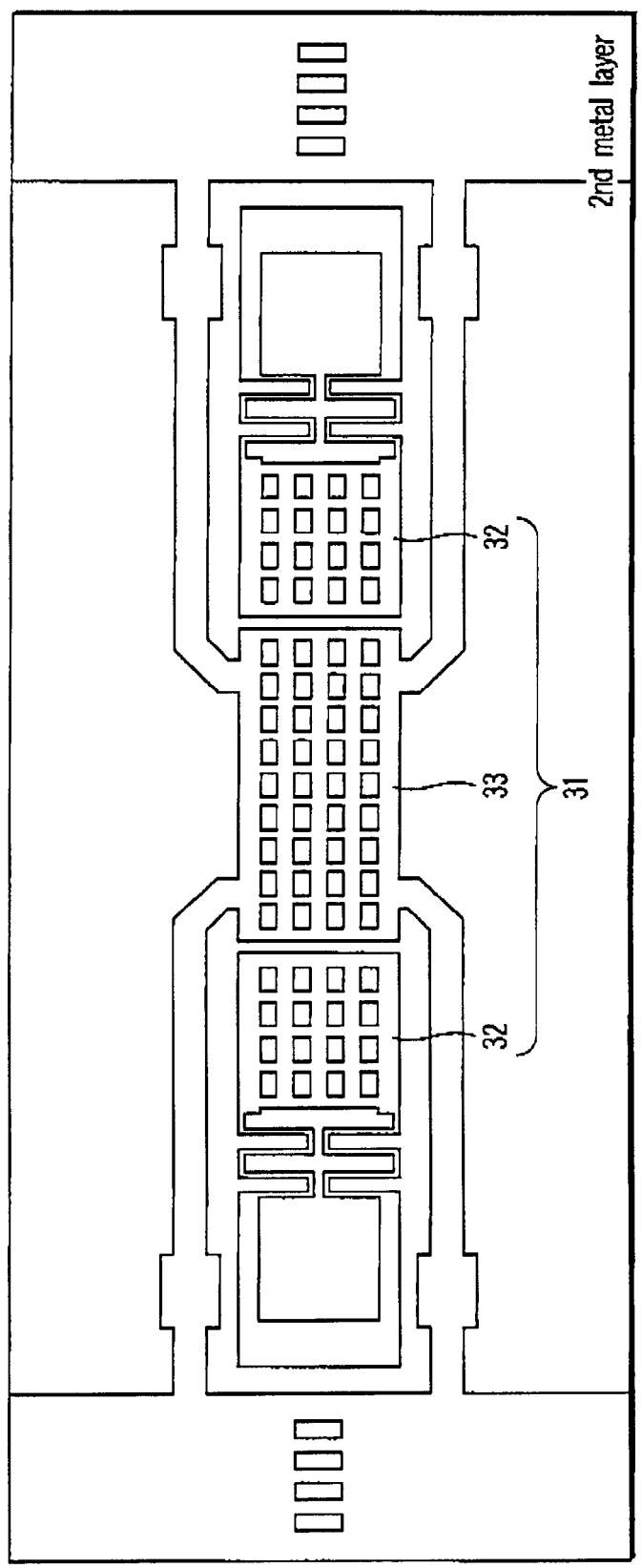
FIG. 28 is a layout of a second metal layer in FIG. 26.

FIG. 26 is a plan view illustrating the variable capacitor according to the tenth example. FIG. 27 illustrates a layout of a first metal layer including a bottom electrode. FIG. 28 illustrates a layout of a second metal layer including an upper electrode.

A moving part 31 is composed of an actuation electrode 32 and an RF-electrode 33. The RF electrode 33 is joined to the actuation electrode 32 by a dielectric joint (insulating film) 34. A sectional shape of the jointed portion is the same as that in FIG. 18. That is to say, "the dielectric joint 34" in FIG. 26 corresponds to the "insulating film 23c" in FIG. 18. An anchor 35 supports the moving part 31.

Driving electrode bias lines 36 are lines for applying bias (driving voltage) to driving electrodes 37, respectively. When the bias is applied to the driving electrodes 37, respectively, a potential difference is generated between the actuation electrode (upper electrode) 32 and the driving electrodes (bottom electrodes) 37 so that the RF-electrode 33 is driven.

A capacitance value of the capacitor is determined by a distance between the RF-electrode 33 and a signal line 38. When the distance therebetween becomes short, the capacitance value becomes large, and when the distance becomes long, the capacitance value becomes small.

A ground line 39 surrounds the driving electrodes 37 so as to electrically separate the driving electrodes 37 from the signal line 38. As a result, the bias to be applied to the driving electrodes 37 prevents an adverse influence to be exerted on the signal line 38.

Figure 29:
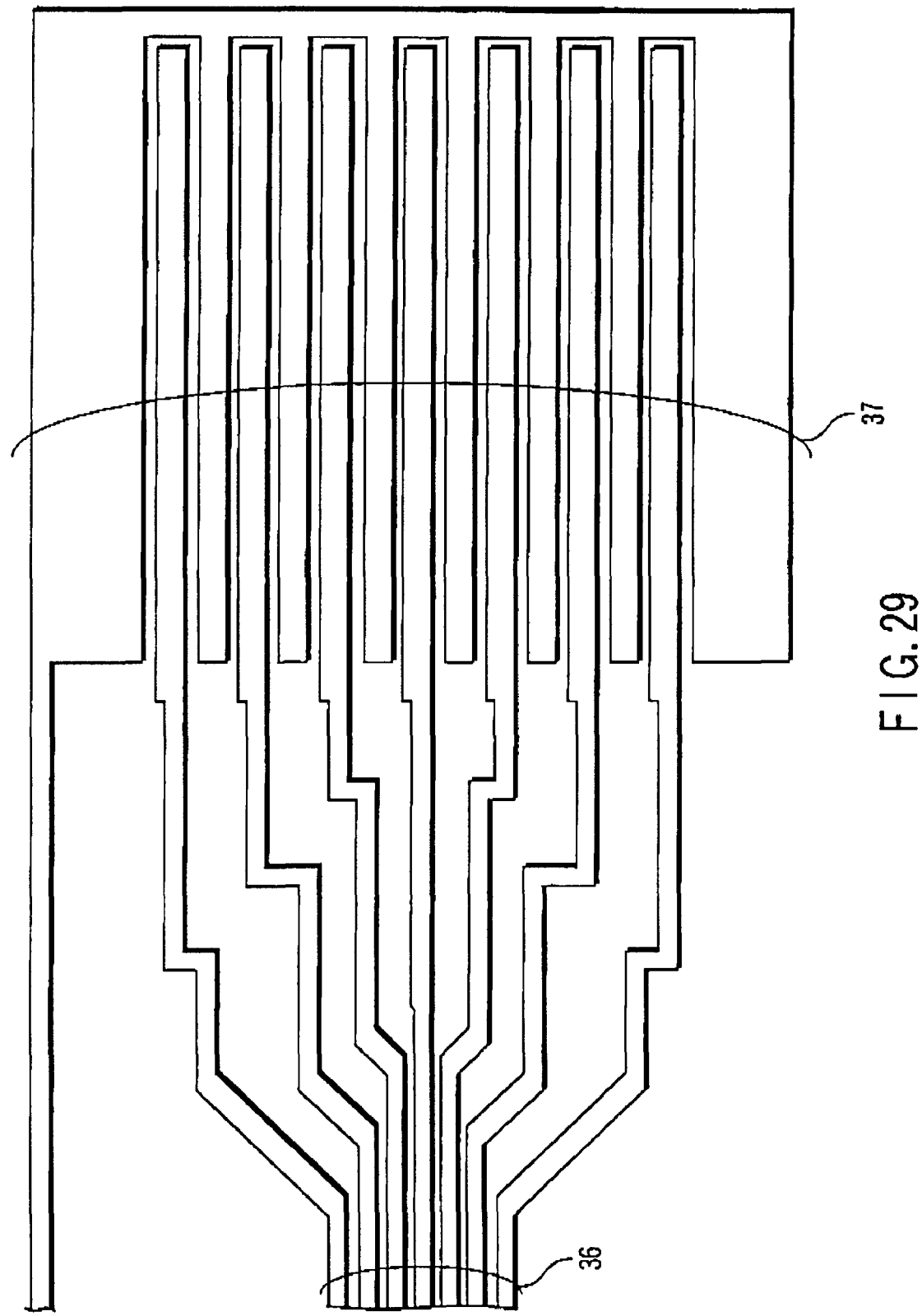
FIG. 29 is an enlarged view of a driving electrode.

FIG. 29 is an enlarged diagram of the driving electrodes.

As is clear from this drawing, the driving electrodes 37 are isolated from one another in a direction y in which the signal line 38 extends, and extends in a direction x perpendicular to the direction y.

With such a layout, an electrostatic force which attracts the RF electrode 33 to the signal line 38 hardly depends on a selecting method of the driving electrodes 37. For this reason, this layout has an advantage such that the high-performance variable capacitor can be easily realized.

(12) Eleventh Example

An eleventh example relates to a system in which the MEMS chip includes a plurality of variable capacitors.

FIG. 30 is a schematic diagram illustrating the system according to the eleventh example.

The MEMS chip includes a plurality of variable capacitors VC1, . . . VCn. A driver chip drives bottom electrodes of the plurality of variable capacitors VC1, . . . VCn.

Besides the memory circuit, a temperature detecting circuit, a voltage generating circuit, a switch circuit and a control circuit shown in FIG. 25 are suitably provided in the driver chip.

When the bottom electrode of one variable capacitor is composed of k elements, the number of the driving electrode bias lines 36 and pads P1-1, P1-2, . . . P1-$k$, . . . , Pn-1, Pn-2, . . . Pn-k is n×k in the entire MEMS chip. A determination is made as to which is selected from the k elements, based on data stored in the memory circuit in the driver chip. The memory circuit is composed of a nonvolatile memory element such as a flash memory or a fuse element.

Alternatively, the determination may be made as to which is selected from the k elements, according to a signal to be output based on a result of detecting a temperature by means of the temperature detecting circuit.

Table 2 shows a method for supplying a driving voltage when the variable capacitor is composed of four elements and the bottom electrode is composed of five elements.

TABLE 2

| Bottom electrode No | 1 | 2 | 3 | 4 | 5 |
|---|---|---|---|---|---|
| Area | 16S | 8S | 4S | 2S | S |
| Variable capacitor No. VC1 | HV | HV | HV | 0 | 0 |
| Variable capacitor No. VC2 | HV | HV | HV | 0 | 0 |
| Variable capacitor No. VC3 | 0 | 0 | 0 | 0 | 0 |
| Variable capacitor No. VC4 | 0 | 0 | 0 | 0 | 0 |

A: Bottom electrode for trimming
B: Selected bottom electrode
C: Un-selected bottom electrode
D: Selected capacitor
E: Un-selected capacitor That is to say, when the variable capacitors VC1 and VC2 are selected and the bottom electrodes Nos. 1, 2 and 3 are selected, an electrode to which the driving voltage HV is applied and an electrode to which 0V is applied are as shown in Table 2.

Electrode areas of the bottom electrodes Nos. 1, 2, 3, 4 and 5 are set to 16S, 8S, 4S, 2S and S, respectively (S: standard area).

In the eleventh example, SIP (System-In-Package) which uses the MEMS chip and the driver chip is assumed, but the MEMS and the driver may be integrated on one chip so that SoC (System-on-Chip) can be structured.

(13) Twelfth Example

A twelfth example relates to a modified example of the eleventh example.

In the eleventh example, a total of n×k driving electrode bias lines are necessary. When n and k are small, the chip area seldom has a problem, but when n and k become large, the number of the driving electrode bias lines increases, and thus the chip area has a problem.

FIG. 31 is a schematic diagram illustrating the system according to the twelfth example.

In the twelfth example, even if n and k are large, the chip area is not enlarged.

The feature of this example is such that in the bottom electrodes of the plurality of variable capacitors VC1, . . . VCn, electrodes which do not have a maximum area (only the electrodes having the same area) are commonly connected (commoditized), and are controlled simultaneously.

In the bottom electrodes of the plurality of variable capacitors VC1, . . . VCn, at least electrodes having the maximum area are controlled independently in each of the variable capacitors VC1, . . . VCn.

For example, electrodes E1-1, . . . En-1 having the maximum area are connected independently to the pads P1, . . . Pn of the MEMS chip. Electrodes having the same area other than the electrodes E1-1, . . . En-1 are commonly connected. That is to say, the electrodes E1-2, . . . En-2 are commonly connected, and its connecting node is connected to the pad Q1 of the MEMS chip. The electrodes E1-$k$, . . . En-k are commonly connected, and its connecting node is connected to the pad QK-1 of the MEMS chip.

Table 3 shows the method of supplying a driving voltage when the variable capacitor is composed of four elements and the bottom electrode is composed of five elements.

TABLE 3

| Bottom electrode No | | 1 | 2 | 3 | 4 | 5 | |
|---|---|---|---|---|---|---|---|
| Area | | 16S | 8S | 4S | 2S | S | |
| Variable capacitor No. | VC1 | HV | HV | HV | 0 | 0 | D |
| | VC2 | HV | HV | HV | 0 | 0 | |
| | VC3 | 0 | HV | HV | 0 | 0 | E |
| | VC4 | 0 | HV | HV | 0 | 0 | |

A (top bracket spans columns 1–5); B: Selected bottom electrode; C: Un-selected bottom electrode A: Bottom electrode for trimming
B: Selected bottom electrode
C: Un-selected bottom electrode
D: Selected capacitor
E: Un-selected capacitor The method of selecting the bottom electrodes and trimming of the electrode area are the same as those in the case of Table 2 in the eleventh example.

As is clear from this table, a voltage to be applied to the bottom electrode No. 1 having the maximum area is determined by selection (HV)/non-selection (0V) of the variable capacitors. On the contrary, voltages to be applied to the other bottom electrodes Nos. 2 to 5 are determined according to the trimming of the electrode area.

In this case, the driving voltage HV is applied to the bottom electrodes Nos. 2 to 3 of the non-selected variable capacitors VC3 and VC4, but the areas of the bottom electrodes Nos. 2 to 3 are sufficiently smaller than that of the bottom electrode No. 1.

Therefore, even if the structure of this example is adopted, the actuator relating to the non-selected variable capacitors VC3 and VC4 is not driven. For this reason, the operation has no problem.

This holds true for the case where the driving voltage HV is applied to the plurality of electrodes among the bottom electrodes Nos. 2 to 5.

When this example is adopted, the number of the driving electrode bias lines 36 and the pads P1, Pn, Q1, ... Qk−1 is n+(k−1). That is to say, since the number is greatly smaller than the number n×k in the eleventh example, an increase in the chip area can be suppressed.

This effect can be obtained by commonly connecting at least one (only the electrode having the same area) of the bottom electrodes (without maximum area) in the variable capacitors VC1, ... VCn.

(14) Thirteenth Example

A thirteenth example relates to a method of applying a voltage to a selected electrode part and a non-selected electrode part.

Figure 32:
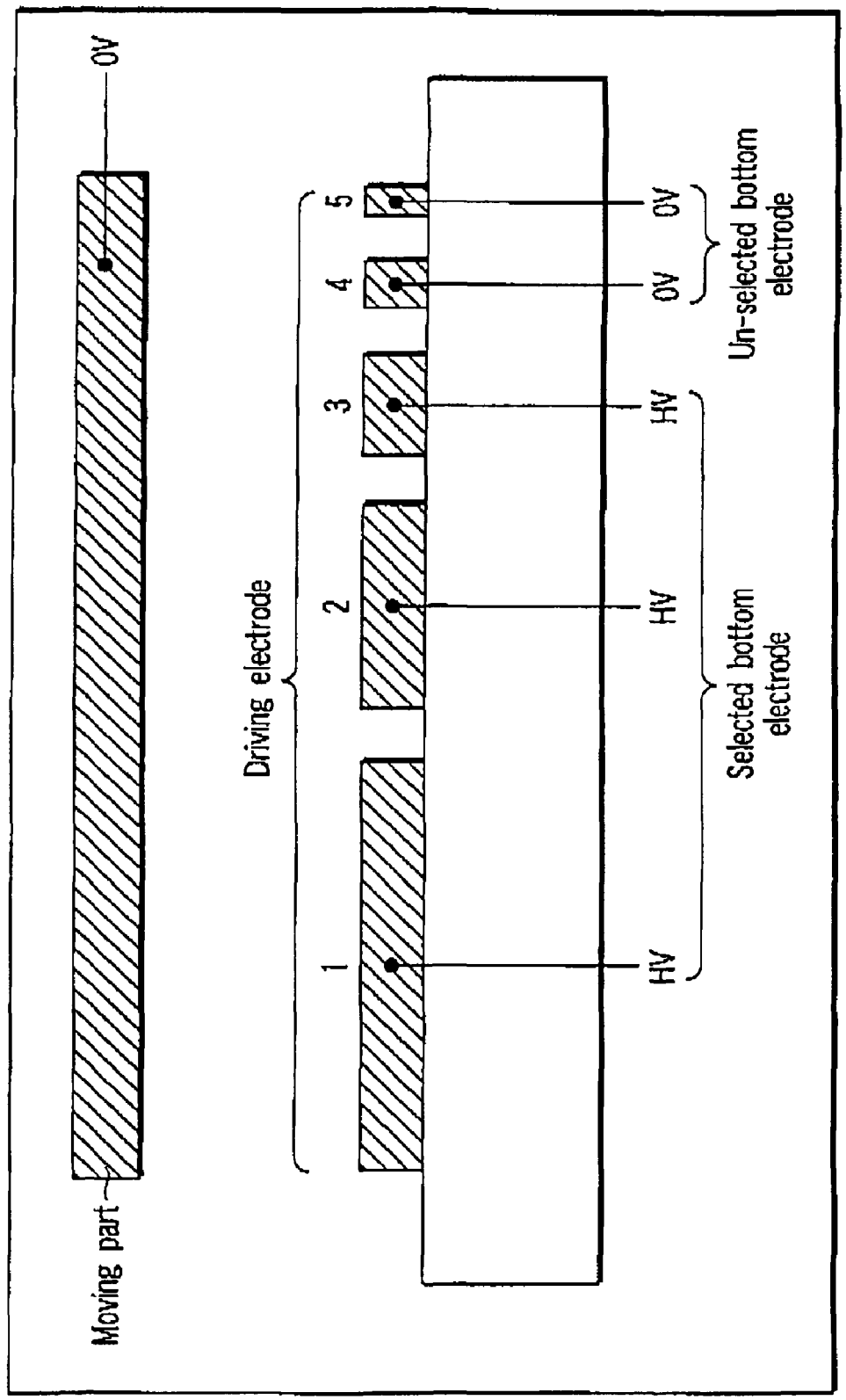
FIG. 32 is a diagram illustrating an electrode part according to a thirteenth example.

FIG. 32 illustrates how to apply a voltage to the selected electrode part and the non-selected electrode part.

In this case, the driving electrodes 1, 2 and 3 are in the selected state, and the driving electrodes 4 and 5 are in the non-selected state. A voltage 0V is applied to an upper electrode as a movable part, and a high voltage HV is applied to the selected electrode part. The voltage HV is 20V, for example. A voltage 0V is applied to the non-selected electrode part. As a result, an electric field is formed only between the selected electrode part and a matched movable part, so that the pull-in voltage can be adjusted.

Figure 33:
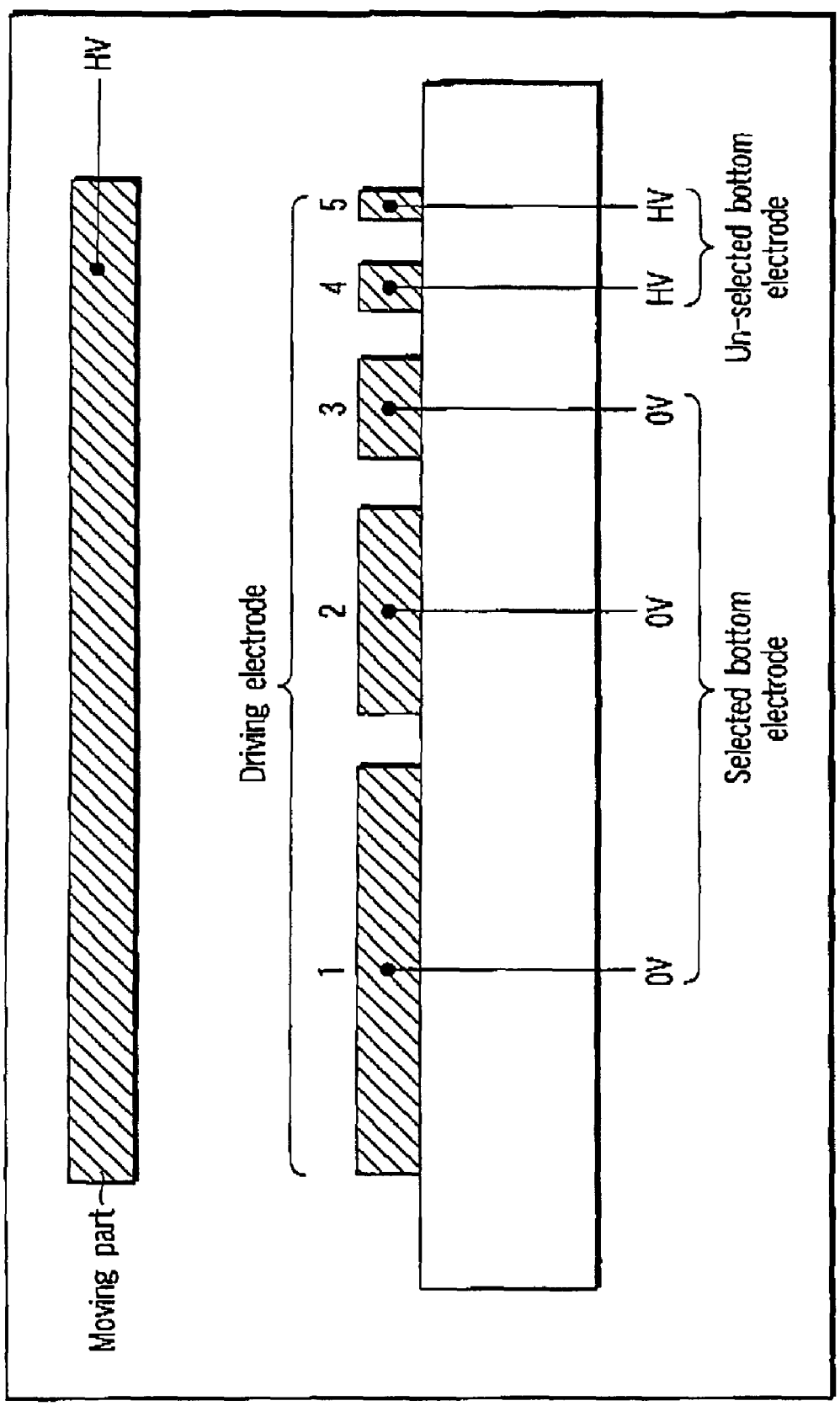
FIG. 33 is a modification of the thirteenth example.

In other words, the quality of the driving method is to set the voltage of the selected electrode part to a value different from the voltage of the matched electrode part, and generate the electric field between both the electrodes. On the other hand, the voltage of the non-selected electrode part is set to the same value as the voltage of its matched electrode part so that the electric field is not generated between both the electrodes. Therefore, as shown in FIG. 33, even when the voltage HV is applied to the upper electrode as the movable part, a voltage 0V is applied to the selected electrode part, and the voltage HV is applied to the non-selected electrode part, the same effect as that in FIG. 32 can be obtained.

Figure 34:
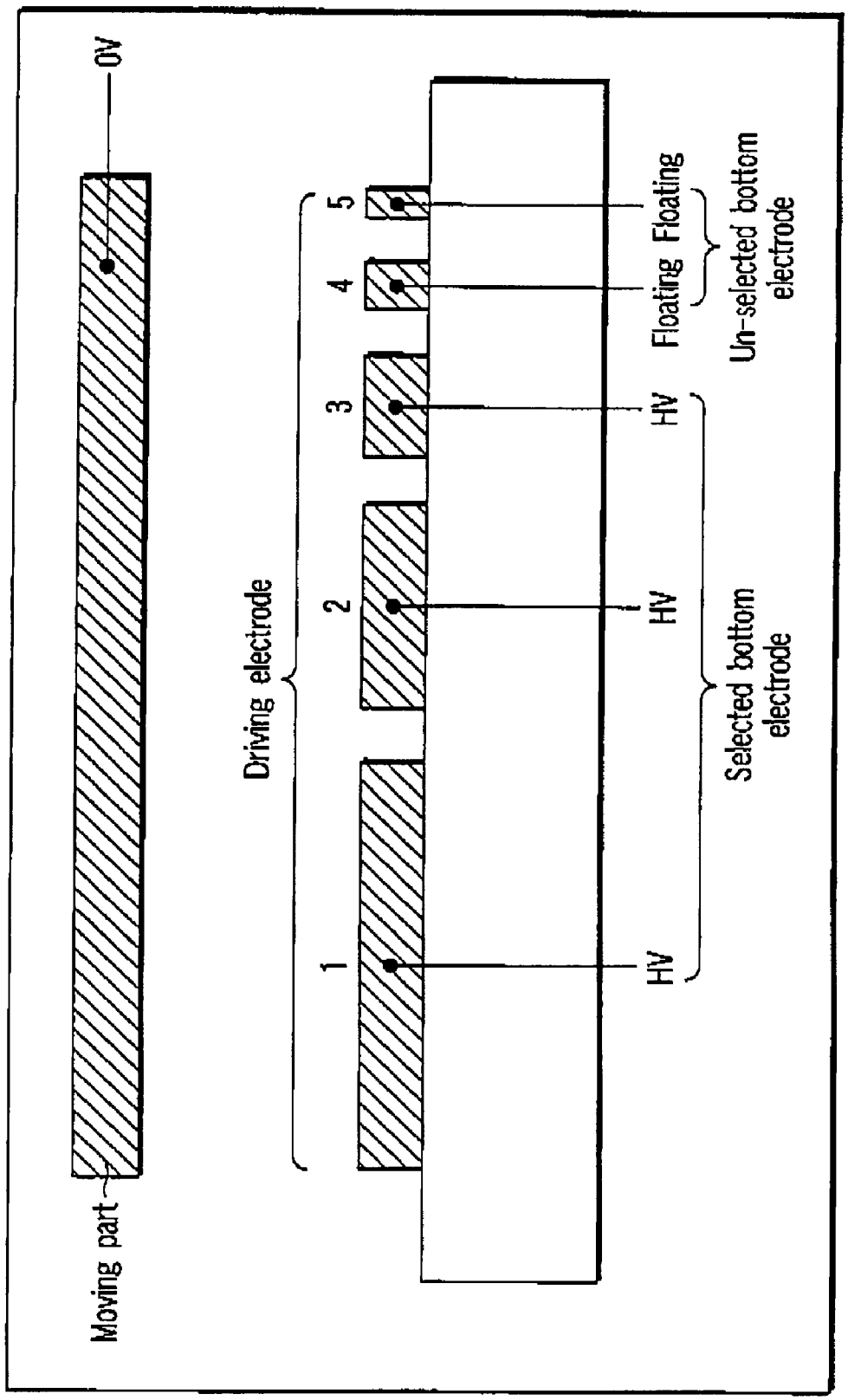
FIG. 34 is a modification of the thirteenth example.
Figure 35:
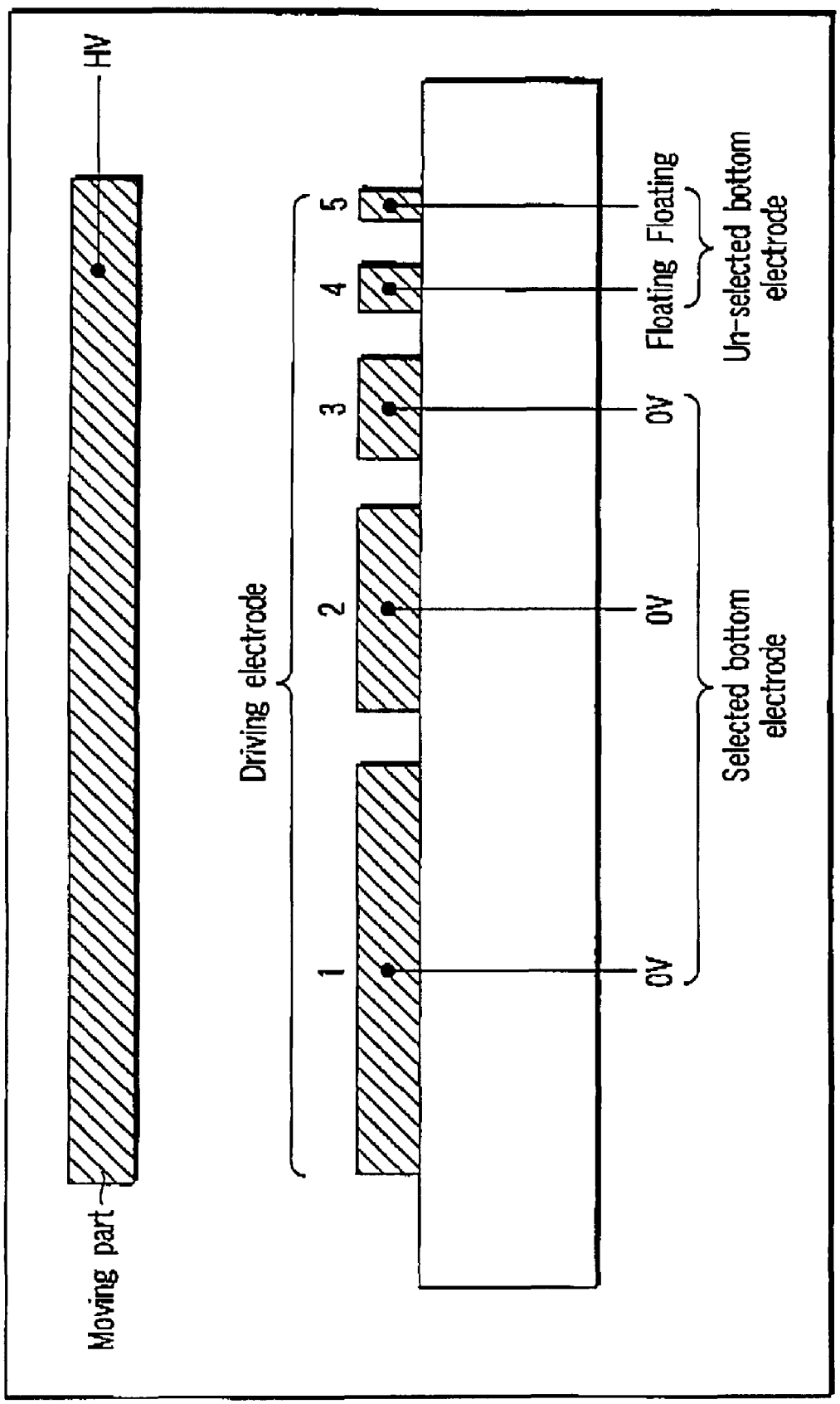
FIG. 35 is a modification of the thirteenth example.

As shown in FIGS. 34 and 35, even if the non-selected electrode part is made to be floated, the electric field is not generated between the electrode part and the upper electrode. For this reason, the same effect as those in FIGS. 32 and 33 can be obtained.

(15) Fourteenth Example

In an example expressed by the MEMS system in FIG. 36, an influence of a process variation between the pull-in voltage and the pull-out voltage is reduced by changing an effective area of the driving electrode.

On the other hand, an influence of a temperature change in the pull-in voltage and the pull-out voltage is cancelled by providing a temperature dependency to the voltages Va and Vh.

That is to say, the MEMS 11 in FIG. 36 has a divided-electrode structure as shown in FIG. 1, and the voltage trimming function due to the divided electrodes is used in order to cancel the process variation. Information on the process variation of each chip is stored in the memory circuit.

On the other hand, the influence of the temperature change in the pull-in voltage and the pull-out voltage is cancelled by providing the temperature dependency shown in FIG. 21 to the voltages Va and Vh. Information on the temperature detected by the temperature detecting circuit is used in order to change the voltages Va and Vh according to the temperature.

(16) Other

In the MEMS systems in the first to fourteenth examples, the moving part has a fixed potential (ground potential), and the driving electrode is formed on the insulating layer on the substrate. Instead of this, the driving electrode is formed on the moving part, and the electrode to which the fixed potential is applied may be arranged on the insulating layer on the substrate.

In such a constitution, the operation and the effect similar to those in the first to ninth examples can be obtained.

The electrostatic actuator in the first to seventh examples may be a hybrid type actuator which is combined with the other types of actuators such as thermal, piezoelectric and electromagnetic actuators.

3. Conclusion

The aspect of the present invention can prevent the deterioration in the reliability of the actuator due to the fluctuation in the pull-in voltage and the pull-out voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An actuator system comprising:
   first and second actuators;
   the first actuator comprising a first moving part, and
   a first driving electrode which is comprised of first electrode parts electrically isolated from each other and drives the first moving part;
   the second actuator comprising a second moving part, and
   a second driving electrode which is comprised of second electrode parts electrically isolated from each other and drives the second moving part;
   wherein a drive voltage is selectively applied to the first and second electrode parts of the first and second actuators to control an electrostatic force which acts on the first and second moving parts, respectively, and one of the first electrode parts and one of the second electrode parts are commonly connected;
   a temperature detecting circuit; and
   a voltage generating circuit which generates the drive voltage;
   wherein the number of the electrode parts to which the drive voltage is applied is determined based on an output signal from the temperature detecting circuit.

2. The actuator system according to claim 1, wherein the number of the electrode parts to which the drive voltage is applied is different before and after pull-in.

3. The actuator system according to claim 1, wherein a voltage of a non-selected electrode part is identical to that of the moving part facing the non-selected electrode part.

4. The actuator system according to claim 1, wherein a non-selected electrode part is floating.

5. The actuator system according to claim 1, wherein sizes of the electrode parts is substantially equal to each other.

6. The actuator system according to claim 1, wherein sizes of the electrode parts are varied in binary fashion.

7. The actuator system according to claim 1, wherein at least one of said first and second actuators constitutes one of a variable capacitor and a switch.

8. The actuator system driving system according to claim 1, wherein a number of the electrode parts to which the drive voltage is applied changes depending on a temperature of a chip on which the first and second actuators are formed.

9. The actuator according to claim 1, further comprising
   a signal line which faces to the moving part of at least one of said first and second actuators,
   wherein a direction to which the electrode parts of said at least one of said first and second actuators are isolated to each other is a direction to which the signal line extends.

* * * * *